(12) United States Patent
Asada et al.

(10) Patent No.: US 7,220,631 B2
(45) Date of Patent: May 22, 2007

(54) METHOD FOR FABRICATING SEMICONDUCTOR DEVICE HAVING HIGH WITHSTAND VOLTAGE TRANSISTOR

(75) Inventors: Hitoshi Asada, Kawasaki (JP); Hiroaki Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/034,948

(22) Filed: Jan. 14, 2005

(65) Prior Publication Data

US 2005/0121726 A1    Jun. 9, 2005

Related U.S. Application Data

(62) Division of application No. 10/663,705, filed on Sep. 17, 2003, now Pat. No. 6,861,704.

(30) Foreign Application Priority Data

Sep. 19, 2002 (JP) ............................ 2002-273851

(51) Int. Cl.
*H01L 21/8238* (2006.01)

(52) U.S. Cl. .................. 438/199; 438/303; 438/630

(58) Field of Classification Search ............... 438/197, 438/199, 217–218, 230, 301, 303, 630, E29.012
See application file for complete search history.

(56) References Cited

U.S. PATENT DOCUMENTS

| 4,614,959 A | 9/1986 | Nakagawa | |
|---|---|---|---|
| 5,183,771 A | * | 2/1993 | Mitsui et al. ............... 438/302 |

(Continued)

FOREIGN PATENT DOCUMENTS

JP    05-067785 A    3/1993

(Continued)

OTHER PUBLICATIONS

European Search Report with Annex dated Jun. 21, 2006, issued in corresponding European Patent Application No. 03020593.4.

*Primary Examiner*—Thanhha S. Pham
(74) *Attorney, Agent, or Firm*—Westerman, Hattori, Daniels & Adrian, LLP.

(57) ABSTRACT

The semiconductor device comprises a gate electrode 26 formed on a semiconductor substrate 10, a source region 45a having a lightly doped source region 42a and a heavily doped source region 44a, a drain region 45b having a lightly doped drain region 42b and a heavily doped drain region 44b, a first silicide layer 40c formed on the source region, a second silicide layer 40d formed on the drain region, a first conductor plug 54 connected to the first silcide layer and a second conductor plug 54 connected to the second silicide layer. The heavily doped drain region is formed in the region of the lightly doped region except the peripheral region, and the second silicide layer is formed in the region of the heavily doped drain region except the peripheral region. Thus, the concentration of the electric fields on the drain region can be mitigated when voltages are applied to the drain region. Thus, even with the silicide layer formed on the source/drain region, sufficiently high withstand voltages of the high withstand voltage transistor can be ensured. Furthermore, the drain region alone has the above-described structure, whereby the increase of the source-drain electric resistance can be prevented while high withstand voltages can be ensured.

4 Claims, 17 Drawing Sheets

U.S. PATENT DOCUMENTS

| | | | |
|---|---|---|---|
| 5,493,142 A | 2/1996 | Randazzo et al. | |
| 5,721,170 A * | 2/1998 | Bergemont | 438/303 |
| 6,597,038 B1 | 7/2003 | Hashimoto | |
| 2002/0000617 A1 | 1/2002 | Mori et al. | |

FOREIGN PATENT DOCUMENTS

| | | |
|---|---|---|
| JP | 06-112219 | 4/1994 |
| JP | 09-260590 | 10/1997 |
| JP | 11-126900 | 5/1999 |
| JP | 11-135781 A | 5/1999 |
| JP | 11-195789 | 7/1999 |
| JP | 11-195789 A | 7/1999 |
| JP | 11-243193 A | 9/1999 |
| JP | 2000-012844 A | 1/2000 |
| JP | 2001-168210 A | 6/2001 |

* cited by examiner

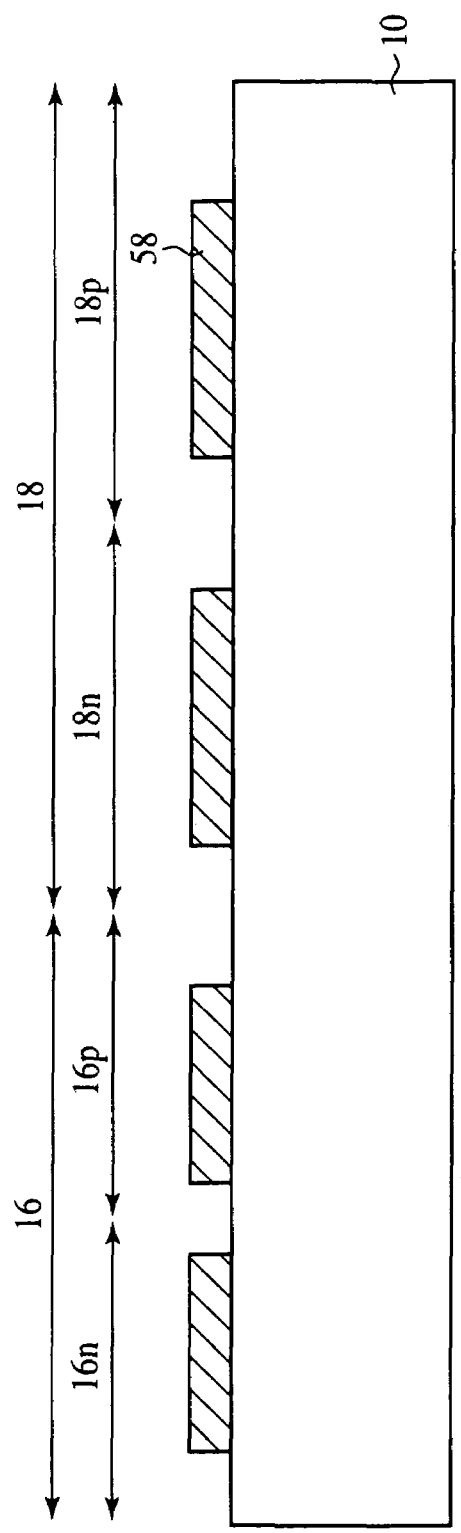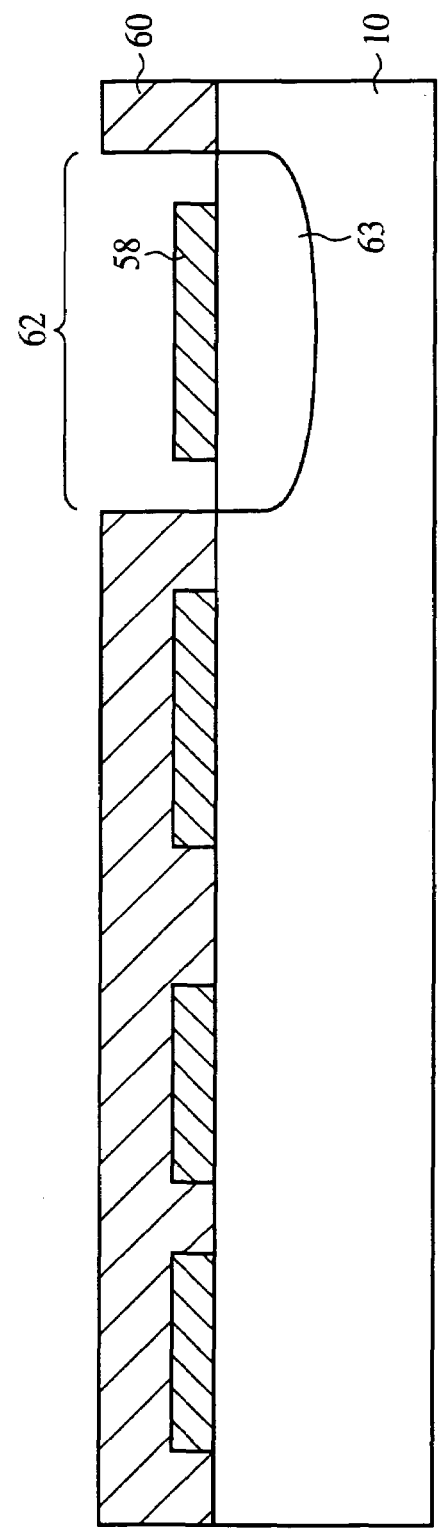
FIG. 3A
FIG. 3B

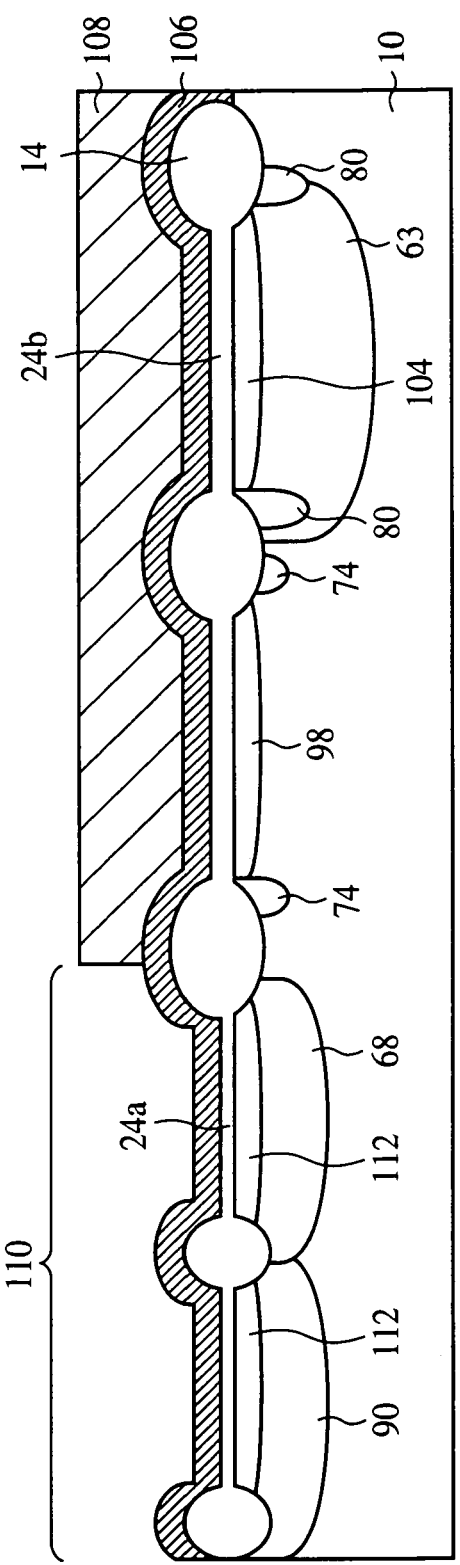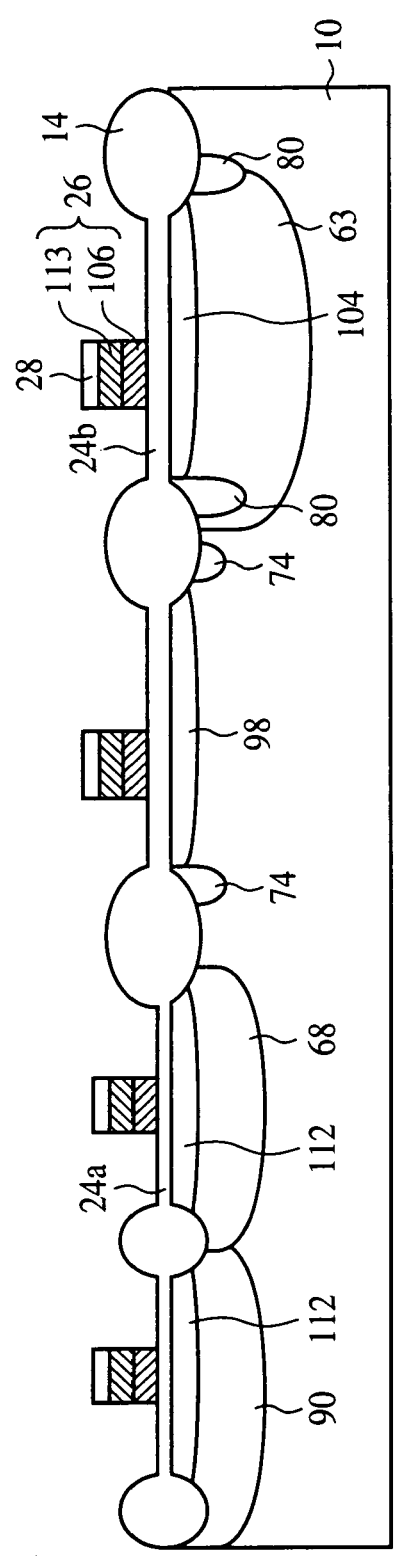
FIG. 8A
FIG. 8B

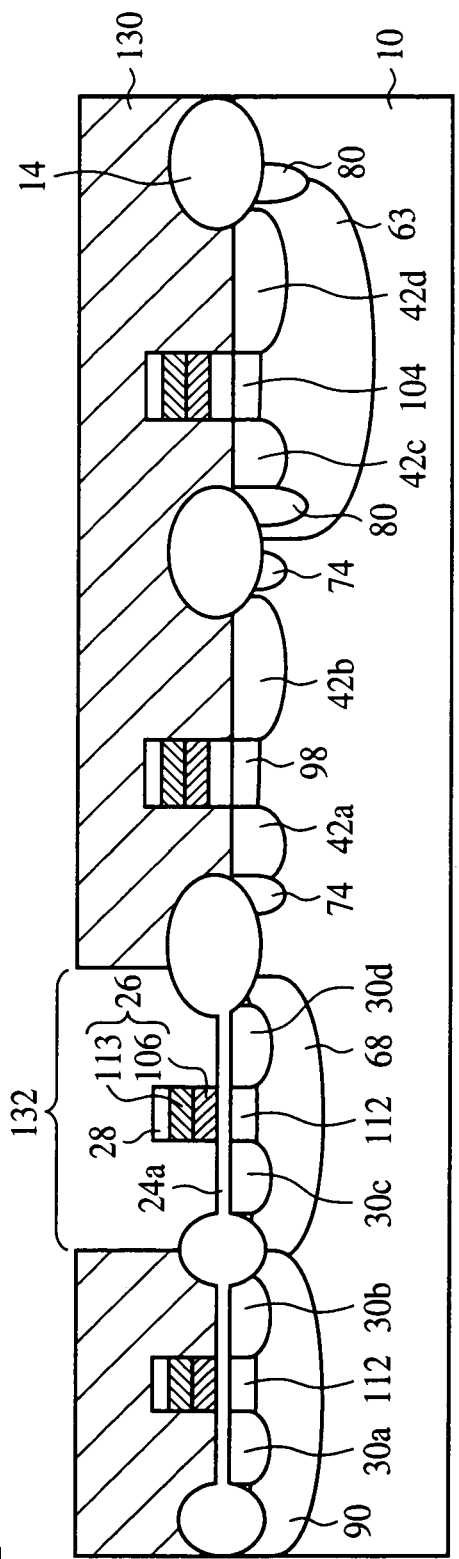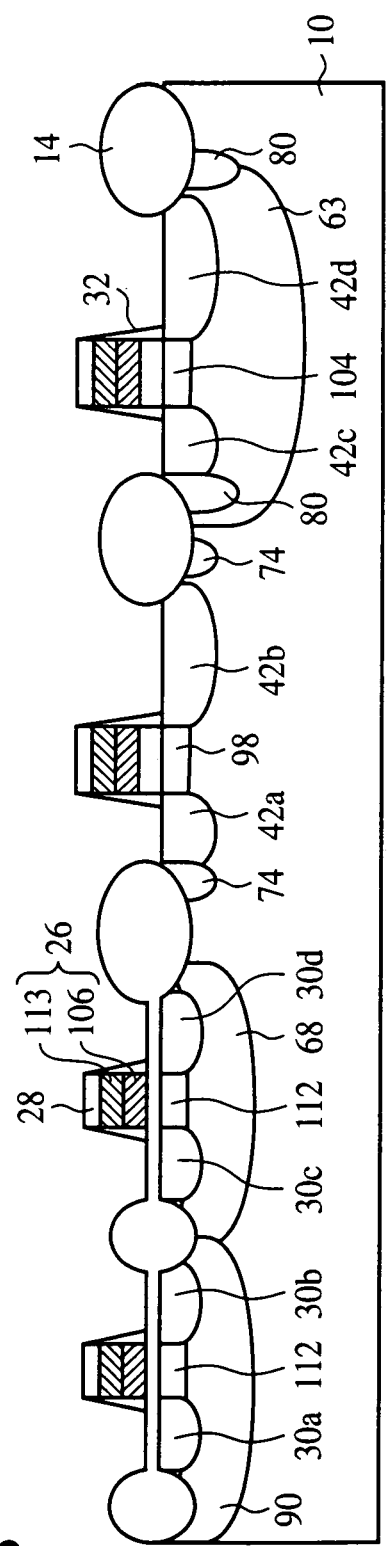

US 7,220,631 B2

METHOD FOR FABRICATING SEMICONDUCTOR DEVICE HAVING HIGH WITHSTAND VOLTAGE TRANSISTOR

CROSS-REFERENCE TO RELATED APPLICATION

This application is a divisional of U.S. patent application Ser. No. 10/663,705 filed on Sep. 17, 2003 which is now U.S. Pat. No. 6,861,704 and claims priority of Japanese Patent Application No. 2002-273851, filed on Sep. 19, 2002 and U.S. patent application Ser. No. 10/633,705 filed on Sep. 17, 2003, the contents being incorporated herein by reference.

BACKGROUND OF THE INVENTION

The present invention relates to a semiconductor device and a method for fabricating the semiconductor device, more specifically a semiconductor device having high withstand voltage transistors and a method for fabricating the semiconductor device.

In organic EL panels, LCD drivers, ink jet printers, etc., it is noted to mount logic transistors, and high withstand voltage transistors mixedly on and the same substrate for the purpose of their general high operational speed.

A proposed semiconductor device having logic transistors, and high withstand voltage transistors mixed mounted will be explained with reference to FIG. 16. FIG. 16 is a sectional view of the proposed semiconductor device. In FIG. 16, a logic region shown on the left side of the drawing, and a high withstand voltage region is shown on the right side of the drawing.

Element isolation regions 214 for defining element regions 212a, 212b are formed on the surface of a semiconductor substrate 210. In the element region 212a of the logic region 216 a transistor 220 of relatively low withstand voltage having a gate electrode 226, a source region 236a and a drain region 236b is formed. The source region 236a has a lightly doped source region 230a and a heavily doped source region 234a. The drain region 236b has a lightly doped drain region 230b and a heavily doped drain region 234b. On the other hand, in the source region 212b of the high withstand voltage region 218 a relatively high withstand voltage transistor 222 having a gate electrode 226, a source region 245a and a drain region 245b is formed. The source region 245a has a lightly doped source region 242a and a heavily doped source region 244a. The drain region 245b has a lightly doped drain region 242b and a heavily doped drain region 244b. An inter-layer insulation film 250 is formed on the semiconductor substrate 210 with the transistors 220, 222 formed on. Conductor plugs 254 are formed in the inter-layer insulation film 250 respectively down to the source regions 236a, 245a and the drain regions 236a, 245b. An interconnection is formed on the inter-layer insulation film 250, connected to the conductor plugs 254.

The proposed semiconductor device, in which the logic transistors 220, and the high withstand voltage transistors 222 are formed mixedly on one and the same substrate, can contribute to higher operation speed of electronic devices.

Recently, semiconductor devices are increasingly micronized. However, simply micronizing a semiconductor device causes increase a contact resistance and a sheet resistance in the source/drain. As a countermeasure to this, in a logic transistor whose gate length is below, e.g., 0.35 μm, usually a silicide layer is formed on the source/drain region for the purpose of depressing the contact resistance and the sheet resistance in the source/drain.

Another proposed semiconductor device which has the silicide layer formed on the source/drain region will be explained with reference to FIG. 17. FIG. 17 is a sectional view of another proposed semiconductor device.

As shown in FIG. 17, the silicide layer 240 is formed respectively on the heavily doped source regions 234a, 244a and the heavily-doped drain regions 234b, 244b.

Said another proposed semiconductor device shown in FIG. 17, in which the silicide layer 240 is formed on the source/drain regions, can be micronized while the contact resistance and the sheet resistance in the source/drain are depressed low.

Patent Reference 1 also discloses a semiconductor device having a silicide layer formed on the source/drain regions.

Following references disclose the background art of the present invention.

[Patent Reference 1]
Specification of Japanese Patent Application Unexamined Publication No. Hei 11-126900
[Patent Reference 2]
Specification of Japanese Patent Application Unexamined Publication No. Hei 9-260590

However, the proposed semiconductor device shown in FIG. 16 cannot ensure sufficient withstand voltage of the high withstand voltage transistors. The semiconductor device proposed in Patent Reference 1 cannot ensure sufficiently high withstand voltage.

Here, it can be proposed that a silicide layer is formed on the source/drain diffused layer of the logic transistors only, and in the high withstand voltage transistor, the silicide layer is not formed, but an insulation film covers the source/drain diffused layer thereof. In this case, however, it is difficult to obtain good contact in the high withstand voltage transistor, and the contact resistance and the sheet resistance in the high withstand voltage transistor are very high.

SUMMARY OF THE INVENTION

An object of the present invention is to provide a semiconductor device which can ensure sufficient withstand voltage even in the case that a silicide layer is formed on the source/drain region, and a method for fabricating the semiconductor device.

According to one aspect of the present invention, there is provided a semiconductor device comprising: a gate electrode formed on semiconductor substrate with an insulation film formed therebetween; a source region formed on one side of the gate electrode and having a lightly doped source region and a heavily doped source region having a higher carrier concentration than the lightly doped source region; a drain region formed on the other side of the gate electrode and having a lightly doped drain region and a heavily doped drain region having a higher carrier concentration than the lightly doped drain region; a first silicide layer formed on the source region; a second silicide layer formed on the drain region; a first conductor plug connected to the first silicide layer; and a second conductor plug connected to the second silicide layer, the heavily doped drain region being formed in a region of the lightly doped drain region except a peripheral part thereof, and the second silicide layer being formed in a region of the heavily doped drain region except a peripheral part thereof.

According to another aspect of the present invention, there is provided a method for fabricating a semiconductor device comprising the steps of: forming a gate electrode on a semiconductor substrate with a gate insulation film formed therebetween; implanting a dopant into the semiconductor substrate with the gate electrode as a mask to form a lightly doped source region in the semiconductor substrate on one side of the gate electrode and a lightly doped drain region in the semiconductor substrate on the other side of the gate electrode; forming a sidewall insulation film on the side wall of the gate electrode; implanting a dopant into the semiconductor substrate with a first mask covering a peripheral region of the lightly doped drain region, the gate electrode and the sidewall insulation film as a mask, to form a heavily doped source region in the semiconductor substrate on one side of the gate electrode and a heavily doped drain region in a region of the lightly doped drain region except a peripheral region thereof; and forming a first silicide layer on the heavily doped source region and a second silicide layer in a region of the heavily doped drain region except the peripheral region thereof, with a second mask formed, covering a peripheral region of the heavily doped drain region.

According to the present invention, the heavily doped drain region is formed in the region of the lightly doped drain region except the peripheral region in the drain region of the high withstand voltage transistor, the silicide layer is formed in the region of the heavily doped drain region except the peripheral region, the conductor plug is formed down to the part of the silicide layer except the peripheral part thereof, and the heavily doped drain region 44 is spaced from the element isolation region, whereby when voltages are applied to the drain region, the concentration of the electric fields on the drain region can be mitigated. Thus, according to the present invention, even with the silicide layer formed on the source/drain region, sufficiently high withstand voltages of the high withstand voltage transistor can be ensured. Furthermore, according to the present invention, the drain region alone has the above-described structure, whereby the increase of the source-drain electric resistance can be prevented while high withstand voltages can be ensured.

BRIEF DESCRIPTION OF THE DRAWINGS

FIGS. 3A and 3B are sectional views of the semiconductor device according to the embodiment in the steps of the method for fabricating the semiconductor device, which show the method (Part 1).

FIGS. 8A and 8B are sectional views of the semiconductor device according to the embodiment in the steps of the method for fabricating the semiconductor device, which show the method (Part 6).

FIGS. 11A and 11B are sectional views of the semiconductor device according to the embodiment in the steps of the method for fabricating the semiconductor device, which show the method (Part 9).

DETAILED DESCRIPTION OF THE INVENTION

Figure 1:
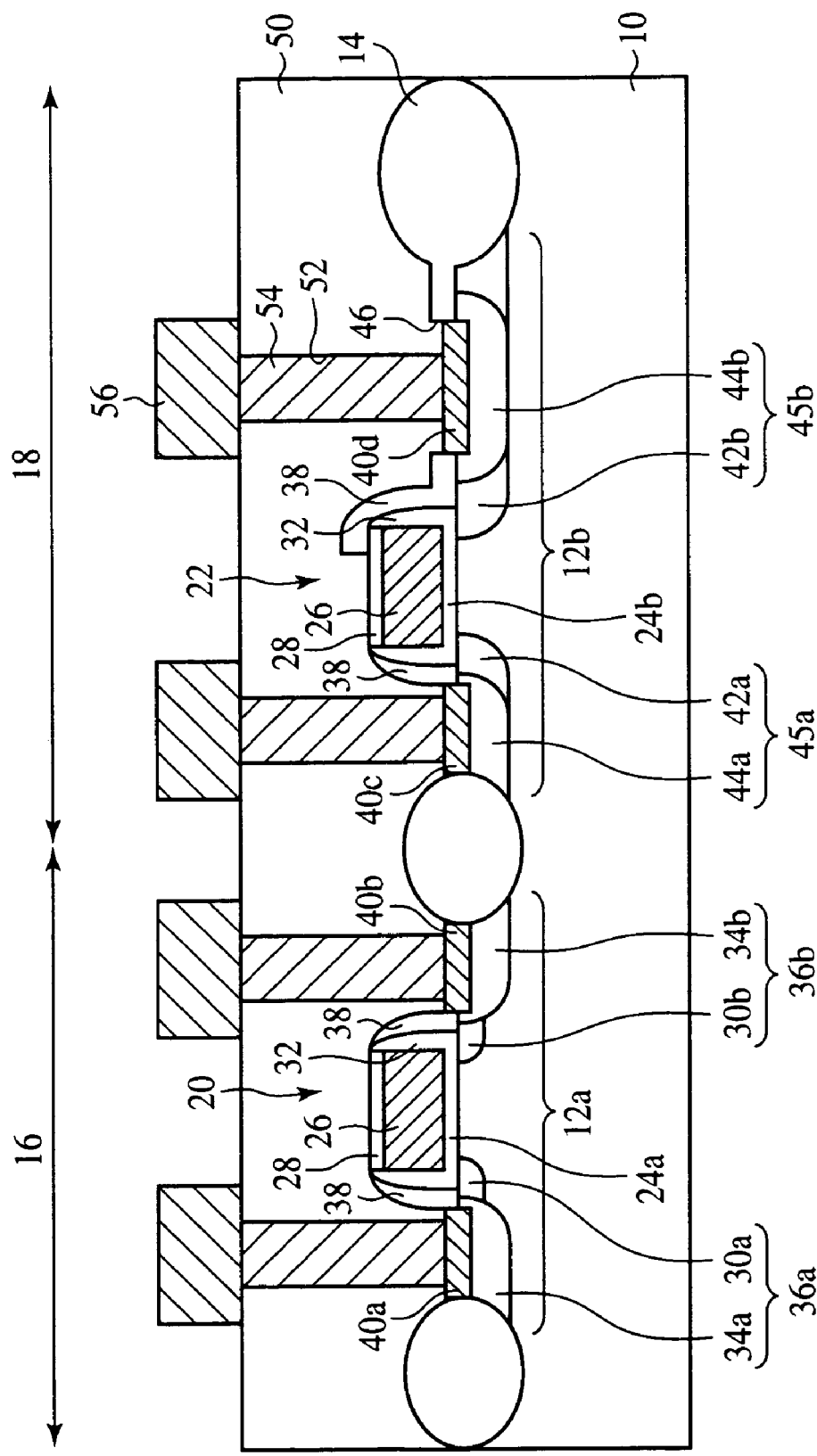
FIG. 1 is a sectional view of the semiconductor device according to one embodiment of the present invention.

The semiconductor device according to one embodiment of the present invention and the method for fabricating the semiconductor device will be explained with reference to FIGS. 1 to 14B. FIG. 1 is a sectional view of the semiconductor device according to the present embodiment. FIG. 2 are a sectional view and a plan view of the semiconductor device according to the present embodiment. FIGS. 3A to 14B are sectional views of the semiconductor device according to the present embodiment in the steps of the method for fabricating the semiconductor device, which show the method.

(The Semiconductor Device)

Figure 2A:
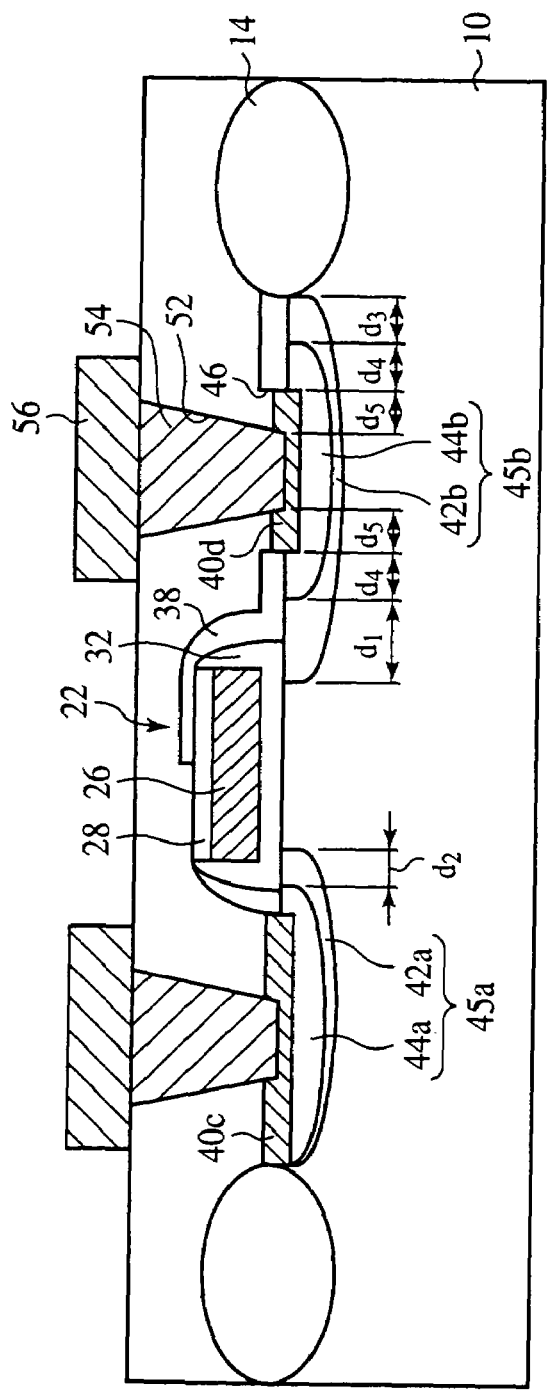
FIGS. 2A and 2B are a sectional view and a plan view of the semiconductor device according to the embodiment of the present invention.
Figure 2B:
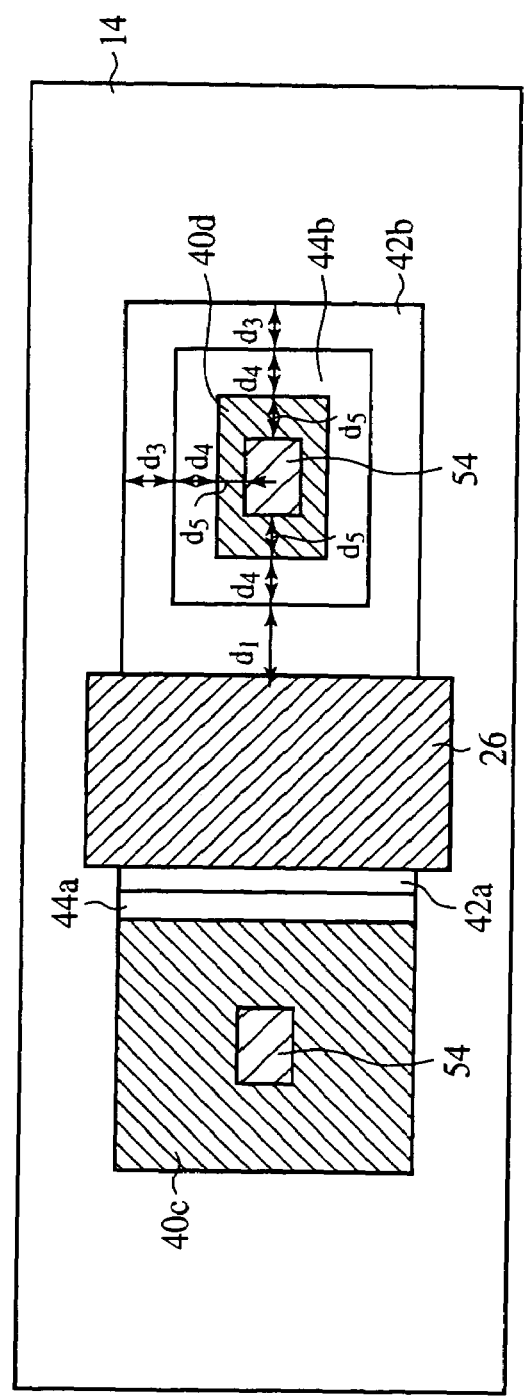

First, the semiconductor device according to the present embodiment will be explained with reference to FIGS. 1 to 2B. FIG. 1 shows a transistor in a logic region and a transistor in a high withstand voltage region, which form the semiconductor device according to the present embodiment. The logic region is shown on the left side of the drawing of FIG. 1, and the high withstand voltage region is shown on the right side of the drawing of FIG. 1. FIGS. 2A and 2B show the transistor in the high withstand voltage region forming the semiconductor device according to the present embodiment. FIG. 2A is a sectional view thereof, and the FIG. 2B is a plan view thereof.

As shown in FIG. 1, an element isolation regions 14 for defining element regions 12a, 12b are formed on a semiconductor substrate 10.

A logic transistor 20 is formed in the element region 12a of the logic region 16. The withstand voltage of the logic transistor 20 is relatively low.

In the element region 12b of the high withstand voltage region 18, a high withstand voltage transistor 22 is formed.

Then, the transistor 20 formed in the logic region 16 will be explained.

As shown in FIG. 1, a gate electrode 26 is formed on the semiconductor substrate 10 with a gate insulation film 24a formed therebetween. A cap film 28 is formed on the gate electrode 26.

In the semiconductor substrate 10 on both side of the gate electrode 26, a lightly doped region 30, specifically, a lightly doped source region 30a and a lightly doped drain region 30b are formed.

A sidewall insulation film 32 is formed on the side wall of the gate electrode 26.

In the semiconductor substrate 10 on both side of the sidewall insulation film 32 formed on the side wall of the gate electrode 26, a heavily doped region 34, specifically a heavily doped source region 34a and heavily doped drain region 34b are formed. The lightly doped source region 30a and a heavily doped source region 34a form a source region 36a. The lightly doped drain region 30b and the heavily doped drain region 34b form a drain region 36b.

A sidewall insulation film 38 is further formed on the side wall of the sidewall insulation film.

A silicide layer 40a, 40b is formed respectively on the source region 36a and the drain region 36b.

Thus, the transistor 20 in the logic region 16 is constituted.

Next, the transistor 22 formed in the high withstand voltage region 18 will be explained.

A gate electrode 26 is formed on the semiconductor substrate 10 with the gate insulation film 24b formed therebetween. The gate insulation film 24b of the transistor 22 in the high withstand voltage region is thicker than the gate insulation film 24a of the transistor 20 of the logic region. A sidewall insulation film 32 is formed on the side wall of the gate electrode 26.

A lightly-doped source region 42a and a lightly doped drain region 42b are formed in the semiconductor substrate 10 on both sides of the gate electrode 26.

A heavily doped region 44, specifically a heavily doped source region 44a and heavily doped drain region 44b are formed in the semiconductor substrate 10 on both side of the gate electrode 26 with the sidewall insulation film 32 formed on the side wall of the gate electrode 26. The lightly doped drain region 42b and the heavily doped drain region 44b constitute the drain region 45b.

As shown in FIG. 2B, the heavily doped drain region 44b is formed in the region of the lightly doped drain region 42b except the peripheral region thereof. In other words, the heavily doped drain region 44b is formed, contained by the lightly doped drain region 42b. The edge of the heavily doped drain region 44b is spaced from the edge of the lightly doped drain region 42b, which mitigates the concentration of the electric fields.

The heavily doped source region 44a is formed at the edge of the lightly doped source region 42a. In other words, the heavily doped source region 44a is not contained by the lightly doped source region 42a.

In the present embodiment, the edge of the heavily doped drain region 44b is spaced from the edge of the lightly doped drain region 42b only in the drain region. This is because of the risk that high voltages are applied, which may cause the dielectric breakdown in the drain region. On the other hand, the source region, where high voltages are not applied, is free from the risk of the dielectric breakdown. It is needless to space the edge of the heavily doped source region 44a from the edge of the lightly doped source region 42a.

The distance $d_1$ between the edge of the heavily doped drain region 44b on the side of the gate electrode 26 and the edge of the lightly doped drain region 42b on the side of the gate electrode 26 is, e.g., 3 μm. On the other hand, the distance $d_2$ between the edge of the heavily doped source region 44a on the side of the gate electrode 26 and the edge of the lightly doped source region 42a on the side of the gate electrode 26 is, e.g., 0.1 μm. That is, in the present embodiment, the distance $d_1$ between the edge of the heavily doped drain region on the side of the gate electrode and the edge of the lightly doped drain region on the side of the gate electrode is larger than the distance $d_2$ between the edge of the heavily doped source region on the side of the gate electrode and the edge of the lightly doped source region on the side of the gate electrode.

In the present embodiment, the distance $d_1$ between the edge of the heavily doped drain region 44b on the side of the gate electrode 26 and the edge of the lightly doped drain region 42b on the side of the gate electrode 26 is 3 μm. However, the distance $d_1$ is not limited to 3 μm and can be suitably set in accordance with a required withstand voltage.

In the present embodiment, the distance $d_2$ of the edge of the heavily doped source region 44a on the side of the gate electrode 26 and the edge of the lightly doped source region 42a on the side of the gate electrode 26 is 0.1 μm. However, the distance $d_2$ is not limited to 0.1 μm and can be suitably set in accordance with a required withstand voltage.

In the present embodiment, a reason why the distance $d_1$ between the edge of the heavily doped drain region 44b on the side of the gate electrode 26 and the edge of the lightly doped drain region 42b on the side of the gate electrode 26 is longer than the distance of the edge of the heavily doped source region 44a on the side of the gate electrode 26 and the edge of the lightly doped source region 42a on the side of the gate electrode 26 is as follows.

That is, with the distance $d_1$ between the edge of the heavily doped drain region 44b on the side of the gate electrode 26 and the edge of the lightly doped drain region 42b on the side of the gate electrode 26 and the distance $d_2$ between the edge of heavily doped source region 42a on the side of the gate electrode 26 and the edge of the lightly doped source region 44a on the side of the gate electrode are long, which raises the source/drain electric resistance. Not only the distance $d_1$ between the edge of the heavily doped drain region 44b on the side of the gate electrode 26 and the edge of the lightly doped drain region 42b on the side of the gate electrode 26 but also the distance $d_2$ between the edge of heavily doped source region 44a on the side of the gate electrode 26 and the edge of the lightly doped source region 42a on the side of the gate electrode are set long, which much raises the source/drain electric resistance. On the other hand, because high voltages are not applied to the source region, the distance between the edge of the lightly doped source region 42a on the side of the gate electrode 26 and the edge of the heavily doped source region 44a on the side of the gate electrode 26, it is needless to set long the distance between the edge of the lightly doped source region 42a on the side of the gate electrode 26 and the edge of the heavily doped region 44a on the side of the gate electrode 26. Then, in the present embodiment, the distance $d_1$ alone between the edge of the lightly doped drain region 42b on the side of the gate electrode 26 and the edge of the heavily doped drain region 44b on the side of the gate electrode 26, which is in the drain region, is set long. Thus, according to the present embodiment, the source-drain electric resistance increase of the high withstand voltage transistor 22 is depressed while high withstand voltages can be ensured.

The distance $d_3$ between the edge of the heavily doped drain region 44b and the edge of the element isolation region 14 is, e.g., 3 μm. The distance $d_3$ between the edge of the heavily doped drain region 44b and the edge of the element isolation region 14 is set to be equal to the distance $d_1$ between the edge of the heavily doped drain region 44b on the side of the gate electrode 26 and the edge of the lightly doped drain region 42b on the side of the gate electrode 26. On the other hand, the edge of the heavily doped source region 44a is adjacent to the edge of the element isolation region 14. In the present embodiment, the distance $d_3$ between the heavily doped drain region 44b and the element isolation region 14 is large so that high withstand voltages of the high withstand voltage transistor 22 can be ensured. On the other hand, high voltages are not applied to the source region, which makes it needless to space the heavily doped source region 44a and the element isolation region 14 from each other.

In the present embodiment, the distance $d_3$ between the edge of the heavily doped drain region 44b and the edge of the element isolation region 14 is set to be 3 μm. The distance $d_3$ is not limited to 3 μm and can be suitably set in accordance with a required withstand voltages.

A sidewall insulation film 38 is further formed on the sidewall insulation film 32 formed on the gate electrode 26. An insulation film 38 is formed on the semiconductor substrate 10 on the side of the drain. The insulation film 38 functions as a mask for forming a silicide layer 40. The insulation film 38 is formed of one and the same film as the sidewall insulation film 38.

An opening 46 is formed in the insulation film 38 down to the heavily doped drain region 44b.

Silicide layers 40c, 40d are formed on the exposed surface of the semiconductor substrate 10. The silicide layer 40d is formed only inside the opening 46 in the drain region. As shown in FIG. 2B, the silicide layer 40d is formed in the region of the heavily doped drain region 44d except the peripheral part thereof. The distance $d_4$ between the edge of the silicide layer 40d on the side of the gate electrode 26 and the edge of the heavily doped drain region 44b on the side of the gate electrode 26 is, e.g., about 1 μm.

In the present embodiment, the distance $d_4$ between the edge of the silicide layer 40d on the side of the gate electrode 26 and the edge of the heavily doped drain region 44b on the side of the gate electrode 26 is about 1 μm but is not limited to 1 μm. Setting the distance $d_4$ between the edge of the silicide layer 40d on the side of the gate electrode 26 and the edge of the heavily doped drain region 44b on the side of the gate electrode 26 to be 0.1 μm or above can mitigate to some extent the concentration of the electric fields and ensure some high withstand voltages. When the distance $d_4$ between the edge of the silicide layer 40d on the side of the gate electrode 26 and the edge of the heavily doped drain region 44b on the side of the gate electrode 26 to be 0.5 μm or above, the concentration of the electric fields can be further mitigated, and accordingly high withstand voltages can be ensured.

The silicide layer 40c in the source region is formed on the edge of the heavily doped source region 44a. This is because it is needless to mitigate the concentration of the electric fields in the source region, to which high voltages are not applied.

Thus, the high withstand voltage transistor 22 is constituted.

An inter-layer insulation film 50 is formed on the entire surface of the semiconductor substrate 10 with the transistors 20, 22 formed on.

Contact holes 52 are formed in the inter-layer insulation film 50 down to the silicide layers 40a–40d. Conductor plugs 54 are buried in the contact holes 52. An interconnection layer 56 is formed on the inter-layer insulation film 50 with the conductor plugs 54 buried in.

The conductor plugs 54 are formed in the parts of the silicide layers 40a–40d except the peripheral parts. In the drain region of the high withstand voltage transistor 22, the distance $d_5$ between the edge of the conductor plug 54 and the edge of the silicide layer 40d is, e.g., 0.3 μm or above. In the present embodiment, the conductor plug 54 is formed down to the part of the silicide layer 40d except the peripheral part so that in the drain region of the high withstand voltage transistor 22, the concentration of the electric fields can be mitigated, and high withstand voltages can be ensured.

In the source region, to which high voltages are not applied, it is needless to make the distance between the edge of the slicide layer 40c and the edge of the conductor plug 54 large.

The semiconductor device according to the present embodiment is characterized mainly in that in the drain region of the high withstand voltage transistor 22, the heavily doped drain region 44b is formed in the part of the lightly doped drain region 42b except the peripheral part, the silicide layer 40d is formed in the region of the heavily doped drain region 44b except the peripheral part, the conductor plug 54 is formed down to the part of the silicide layer 40d except the peripheral part, and the heavily doped drain region 44b is spaced from the element isolation region 14.

Figure 16:
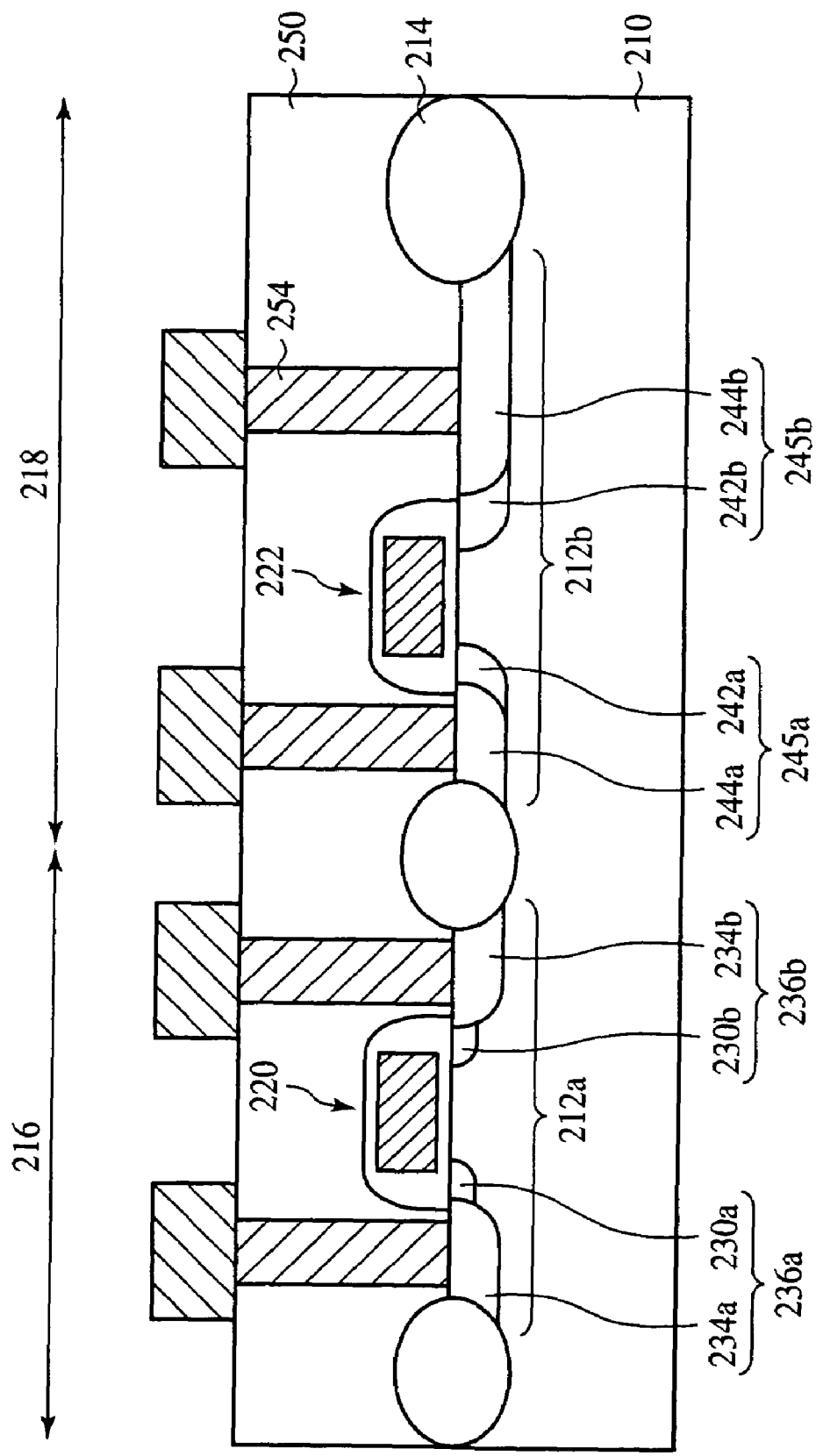
FIG. 16 is a sectional view of the proposed semiconductor device.
Figure 17:
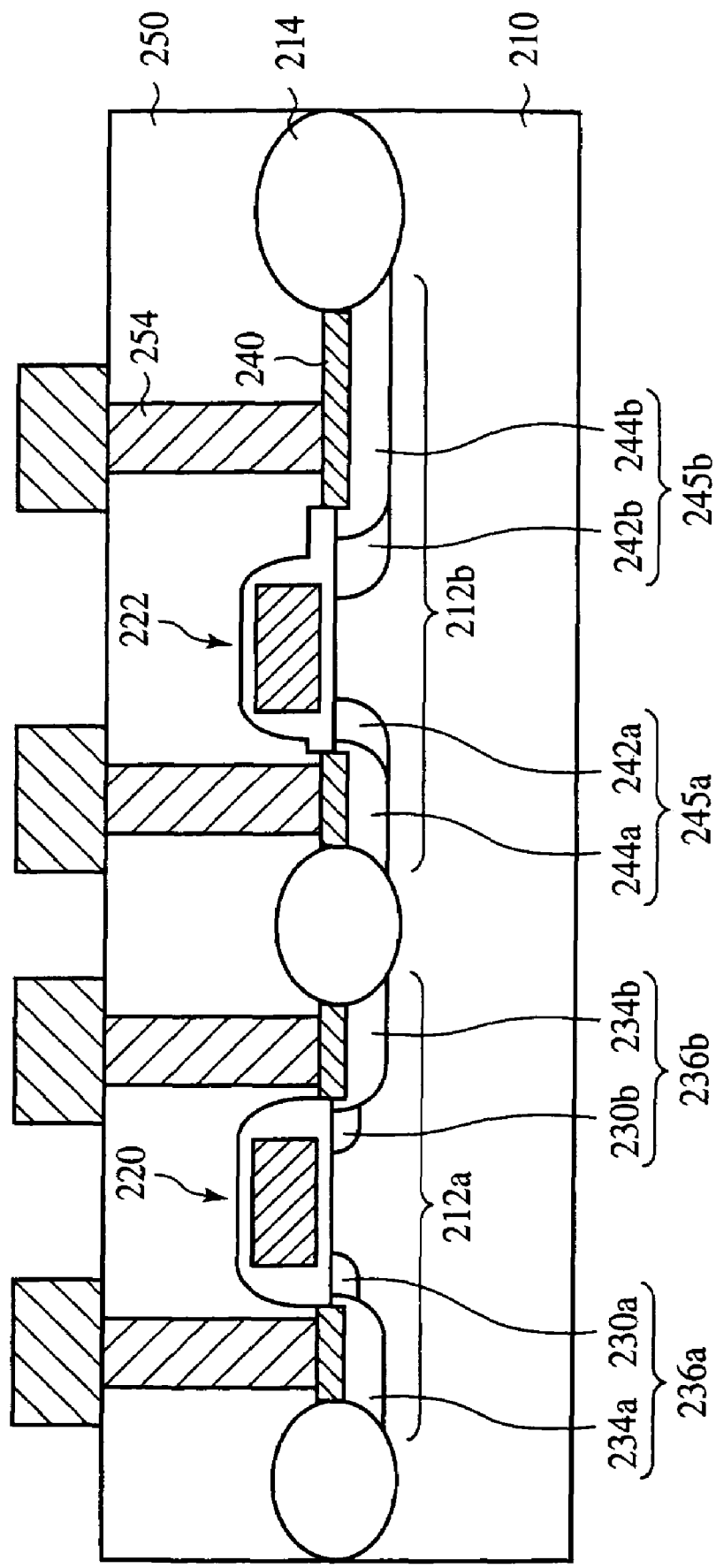
FIG. 17 is a sectional view of another proposed semiconductor device.

In said another proposed semiconductor device shown in FIG. 16, the electric fields are concentrated on the drain region of the high withstand voltage transistor, and high withstand voltages cannot be obtained.

In contrast to this, according to the present embodiment, when high voltages are applied to the drain region, which is constituted as described above, the concentration of the electric fields on the drain region can be mitigated. Thus, according to the present embodiment, even with the silicide layer formed on the source/drain region, the withstand voltages in the high withstand voltage transistor can be sufficiently high. Furthermore, according to the present embodiment, the drain region alone has the above-described structure, whereby the increase of the source-drain electric resistance can be prevented while high withstand voltages can be ensured.

The above-described Patent Reference 1 discloses a semiconductor device in which double side wall insulation films are formed, a silicide layer is formed in the heavily doped source/drain region, spaced from the gate electrode, and the conductor plug is formed down to the silicide layer. The semiconductor device disclosed in Patent Reference 1 is largely different from the semiconductor device according to the present embodiment in that in the former, the heavily doped drain region is formed also on the edge of the lightly doped drain region, the silicide layer is formed also on the edge of the heavily doped drain region, and the heavily doped drain region is not spaced from the element isolation region. The semiconductor device described in Patent Reference 1 cannot sufficiently mitigate the concentration of the electric fields in the drain region, and sufficient withstand voltages cannot be ensured.

(The Method for Fabricating the Semiconductor Device)

Next, the method for fabricating the semiconductor device according to the present embodiment will be explained with reference to FIGS. 3A to 14B.

First, as shown in FIG. 3A, a mask 58 is formed respectively in a region 16n where a logic n-channel transistor to be formed in, a region 16p where a logic p-channel transistor to be formed in, a region 18n where an n-channel transistor of a high withstand voltage region, and in a region 18p where a p-channel transistor of the high withstand voltage region to be formed in. A material of the mask 58 can be, e.g., SiN. The thickness of the mask 58 is, e.g., 120 nm.

Then, as shown in FIG. 3B, a photoresist film 60 is formed on the entire surface by, e.g., spin coating. Then, an opening 62 for opening the region 18p for the p-channel transistor of the high withstand voltage region is formed by photolithography.

Then, with the photoresist film 60 as a mask, an n type dopant is implanted in the semiconductor substrate 10 by, e.g., ion implantation. As the dopant, P (phosphorus), for example, is used. Conditions for the ion implantation are, e.g., a 180 keV acceleration voltage and a $6 \times 10^{12}$ cm$^{-2}$ dose. An n type well 63 is thus formed in the semiconductor substrate 10 in the region 18p for the p-channel transistor of the high withstand voltage region.

Next, the dopant implanted in the n type well 63 is activated by thermal processing.

Figure 4A:
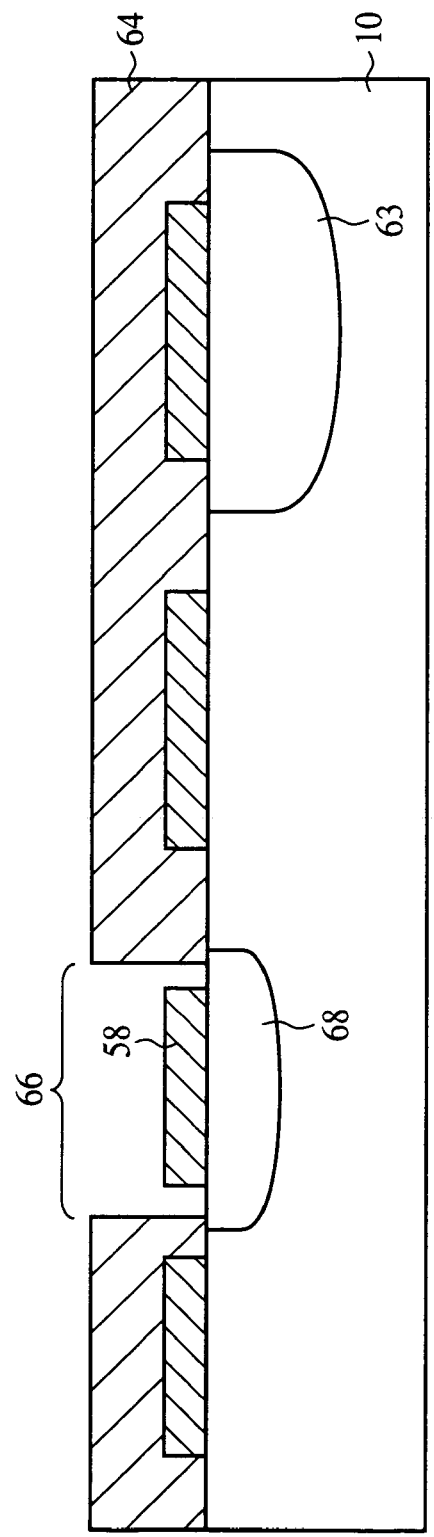
FIGS. 4A and 4B are sectional views of the semiconductor device according to the embodiment in the steps of the method for fabricating the semiconductor device, which show the method (Part 2).

Then, as shown in FIG. 4A, a photoresist film 64 is formed on the entire surface by, e.g., spin coating. Then, an opening 66 for opening the region 16p for the p-channel transistor of the logic region to be formed in is formed in the photoresist film 64.

Next, with the photoresist film 64 as a mask, an n type dopant is implanted into the semiconductor substrate 10 by, e.g., ion implantation. The dopant is, e.g., P. Conditions for the ion implantation are, e.g., a 180 keV acceleration voltage and a $1.5 \times 10^{13}$ cm$^{-2}$ dose. An n type well 68 is thus formed in the semiconductor substrate 10 in the region 16p for the p-channel transistor for the logic region to be formed in.

Then, thermal processing is performed to activate the dopant implanted in the n type well 68.

Figure 4B:
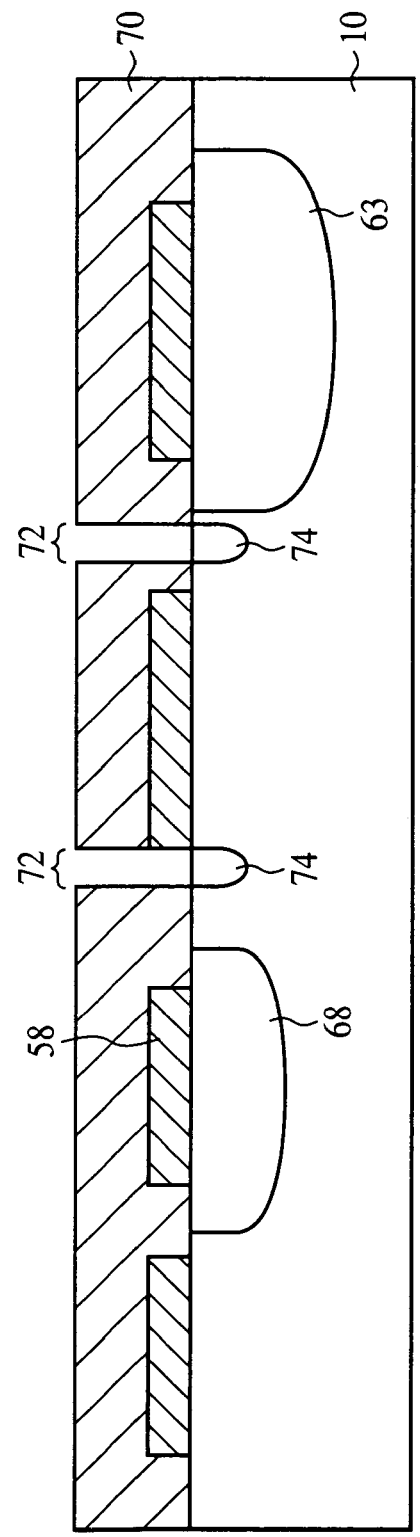

Next, as shown in FIG. 4B, a photoresist film 70 is formed on the entire surface by, e.g., spin coating. Then, an opening 72 is formed in the photoresist film 70 down to the semiconductor substrate 10 by photolithography. The opening 72 is for forming a channel stop layer 74 of the n-channel transistor 22n (see FIG. 14B) of the high withstand voltage region.

Then, with the photoresist film 70 as a mask, a p type dopant is implanted into the semiconductor substrate 10 by, e.g., ion implantation. The dopant is, e.g., B (boron). Conditions for the ion implantation are, e.g., a 20 keV acceleration voltage and a $5 \times 10^{14}$ cm$^{-2}$ dose. The channel stop layer 74 of the n-channel transistor 22n of the high withstand voltage region is thus formed.

Figure 5A:
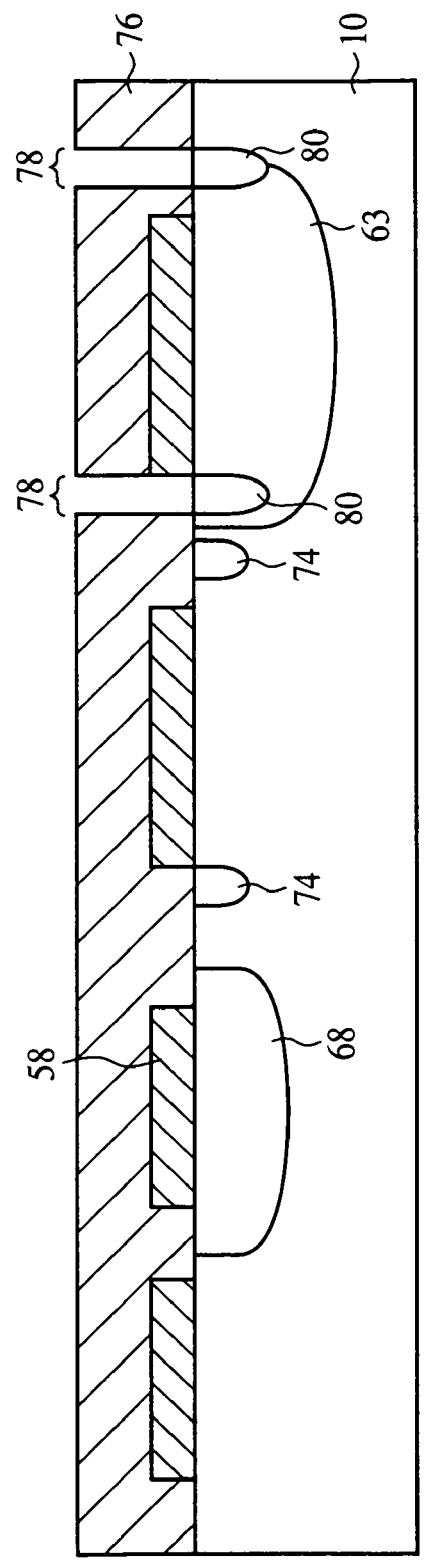
FIGS. 5A and 5B are sectional views of the semiconductor device according to the embodiment in the steps of the method for fabricating the semiconductor device, which show the method (Part 3).

Next, as shown in FIG. 5A, a photoresist film 76 is formed on the entire surface by, e.g., spin coating. Next, openings 78 are formed in the photoresist film 76 down to the semiconductor substrate 10 by photolithography. The openings 78 are for forming a channel stop layer 80 of the p channel transistor 22p of the high withstand voltage region (see FIG. 14B).

Then, with the photoresist film 76 as a mask, an n type dopant is implanted into the semiconductor substrate 10 by, e.g., ion implantation. The dopant is, e.g., P. Conditions for the ion implantation are, e.g., a 60 keV acceleration voltage and a $2.5 \times 10^{13}$ cm$^{-2}$ dose. The channel stop layer 80 of the p-channel transistor 22p of the high withstand voltage region is thus formed.

Figure 5B:
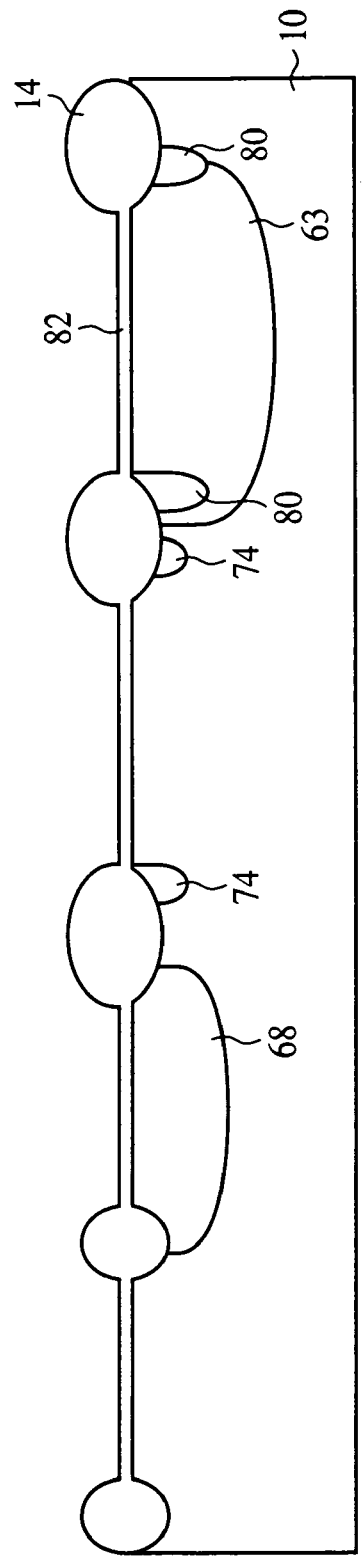

Next, as shown in FIG. 5B, element isolation regions 14 are formed on the semiconductor substrate 10 by, e.g., LOCOS (LOCal Oxidation of Silicon).

Then, a mask 58 is removed.

Next, a protection film 82 of an SiO$_2$ film of, e.g., a 15 nm-thickness is formed on the entire surface by, e.g., thermal oxidation.

Then, the protection film 82 is removed by etching the entire surface.

Figure 6A:
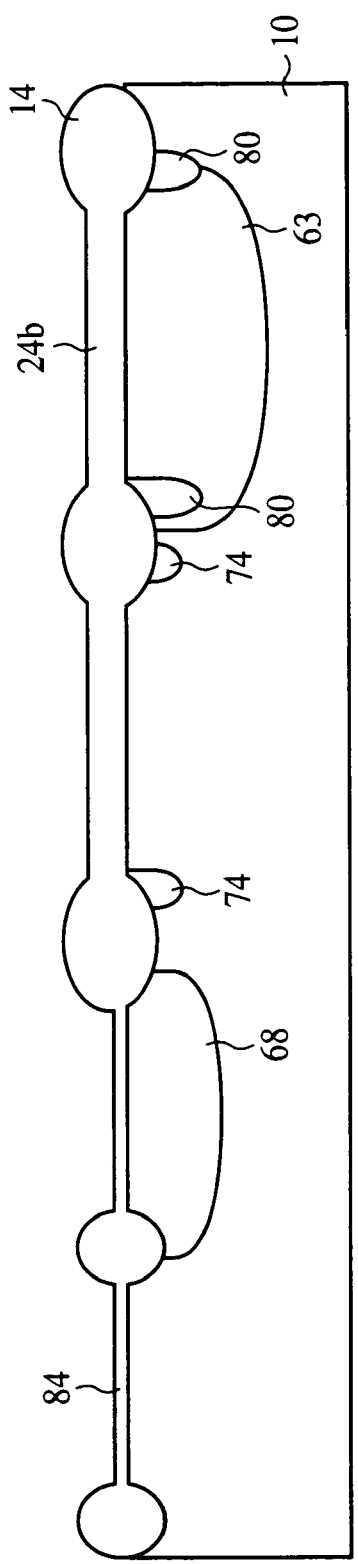
FIGS. 6A and 6B are sectional views of the semiconductor device according to the embodiment in the steps of the method for fabricating the semiconductor device, which show the method (Part 4).

Next, as shown in FIG. 6A, a gate insulation film 24b of an SiO$_2$ film of, e.g., a 90 nm-thickness is formed on the entire surface.

Then, the gate insulation film 24b formed in the regions 16n, 16p for the logic transistor to be formed in is removed.

Next, a protection film 84 of an SiO$_2$ film of, e.g., a 15 nm-thickness is formed on the entire surface.

Figure 6B:
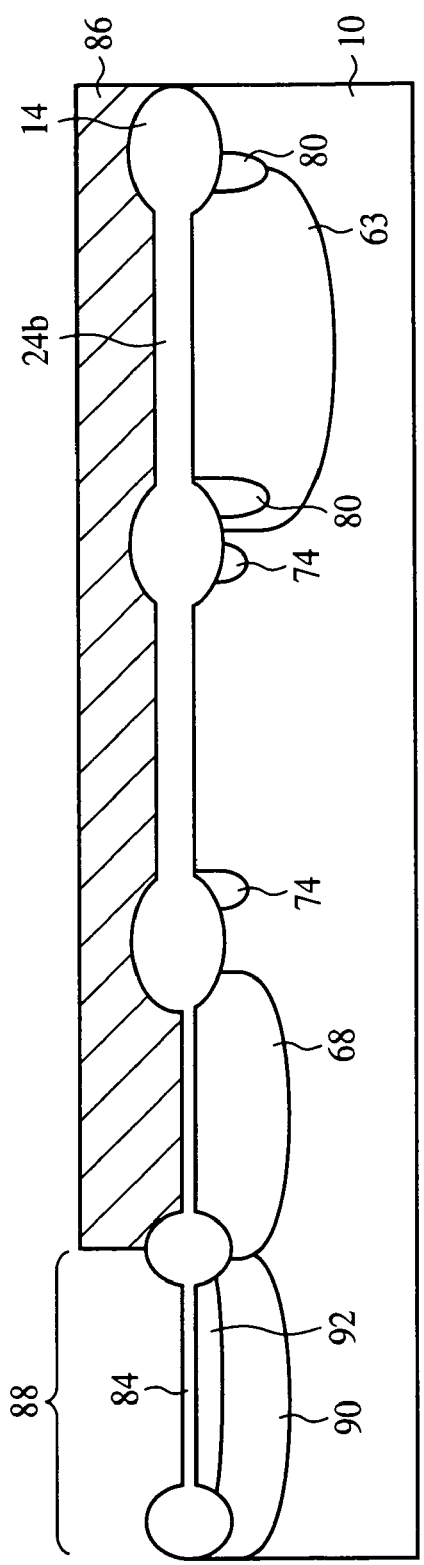

Then, as shown in FIG. 6B, a photoresist film 86 is formed on the entire surface by, e.g., spin coating. Next, an opening 88 for opening the region 16n for the n-channel transistor of the logic region to be formed in is formed in the photoresist film 86.

Next, with the photoresist film 86 as a mask, a p type dopant is implanted into the semiconductor substrate 10 by, e.g., ion implantation. The dopant is, e.g., B. Conditions for the ion implantation are, e.g., a 140 keV acceleration energy and a $8 \times 10^{12}$ cm$^{-2}$ dose. A p type well 90 is thus formed in the region 16n for the n-channel transistor of the logic region to be formed in.

Then, with the photoresist film 96 as a mask, a p type dopant is implanted into the semiconductor substrate 10 by, e.g., ion implantation. The dopant is, e.g., B. Conditions for the ion implantation are, e.g., a 30 keV acceleration energy and a $3 \times 10^{12}$ cm$^{-2}$ dose. A channel doped layer 92 is formed in the region 16n for the n-channel transistor of the logic region to be formed in. The channel doped layer 92 is for controlling the threshold voltage.

Figure 7A:
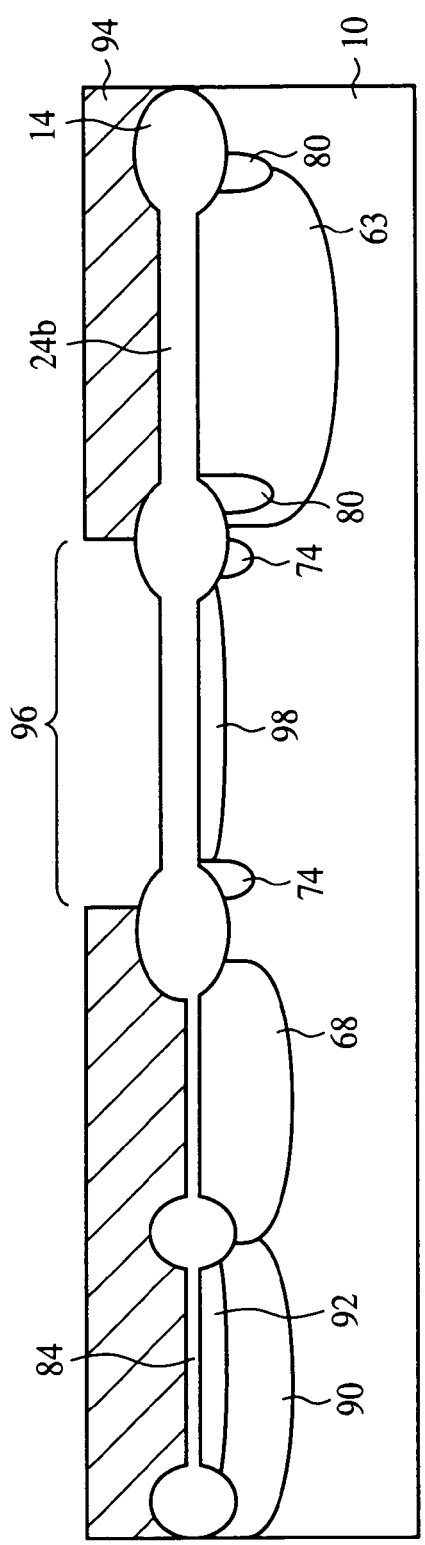
FIGS. 7A and 7B are sectional views of the semiconductor device according to the embodiment in the steps of the method for fabricating the semiconductor device, which show the method (Part 5).

Next, as shown in FIG. 7A, a photoresist film 94 is formed on the entire surface by, e.g., spin coating. Then, an opening 96 for opening the region 18n for the n-channel transistor of the high withstand voltage to be formed in is formed in the photoresist film 94 by photolithography.

Then, with the photoresist film 94 as a mask, a p type dopant is implanted into the semiconductor substrate 10 by, e.g., ion implantation. The dopant is, e.g., B. Conditions for the ion implantation are, e.g., 45 keV acceleration energy and a $2 \times 10^{11}$ cm$^{-2}$ dose. The channel doped layer 98 is thus formed in the region 18n for the n-channel transistor of the high withstand voltage region to be formed in.

Figure 7B:
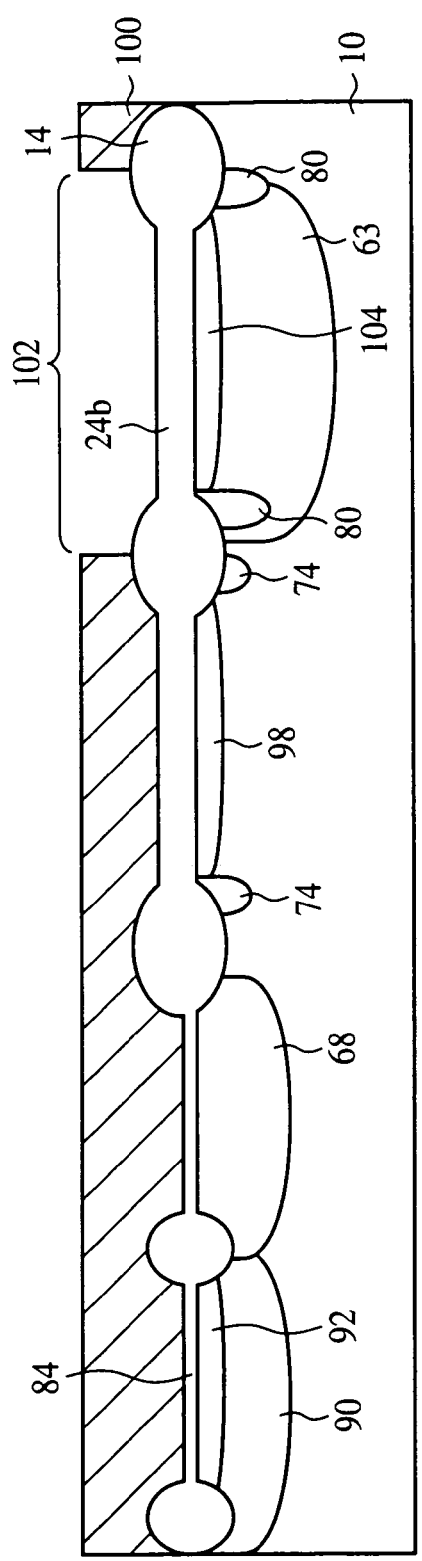

Then, as shown in FIG. 7B, a photoresist film 100 is formed on the entire surface by, e.g., spin coating. Then, an opening 102 for opening the region 18n for the n-channel transistor of the high withstand voltage region to be formed in is formed in the photoresist film 100.

Next, with the photoresist film 100 as a mask, an n type dopant is implanted into the semiconductor substrate 10 by, e.g., ion implantation. The dopant is, e.g., B. Conditions for the ion implantation are, e.g., a 45 keV acceleration energy and a $8 \times 10^{11}$ cm$^{-2}$ dose. A channel doped layer 104 is thus formed in the region 18p for the p-channel transistor of the high withstand voltage region to be formed in.

Then, as shown in FIG. 8A, the protection film 84 formed in the regions 16n, 16p for the logic transistor to be formed in is removed.

Then, a gate insulation film 24a of an SiO$_2$ film of, e.g., a 7 nm-thickness is formed in the regions 16n, 16p for the logic transistor to be formed in.

Then, a 50 nm-thickness doped amorphous silicon film 106 is formed on the entire surface by, e.g., CVD. The amorphous silicon film 106 is for forming the gate electrode 26.

Then, a photoresist film 108 is formed on the entire surface by, e.g., spin coating. Then, an opening 110 for opening the logic region 16 is formed in the photoresist film 108 by photolithography.

Next, with the photoresist film 108 as a mask, a p type dopant is implanted in the semiconductor substrate 10 by, e.g., ion implantation. The dopant is, e.g., B. Conditions for the ion implantation are, e.g., a 30 keV acceleration energy and a 2×10$^{12}$ cm$^{-2}$ dose. A channel doped layer 112 is thus formed in the logic region 16.

Then, a tungsten silicide film 113 is formed on the amorphous silicon film 106.

Next, a cap film 28 of an SiO$_2$ film of, e.g., a 45 nm-thickness is formed on the entire surface by CVD.

Then, the cap film 28 is patterned by photolithography.

Next, with the cap film 28 as a mask, the tungsten silicide film 113 and the doped amorphous silicon film 106 are etched. The gate electrode 26 is thus formed of the amorphous silicon film 106 and the tungsten silicide film 113 (see FIG. 8B).

Figure 9A:
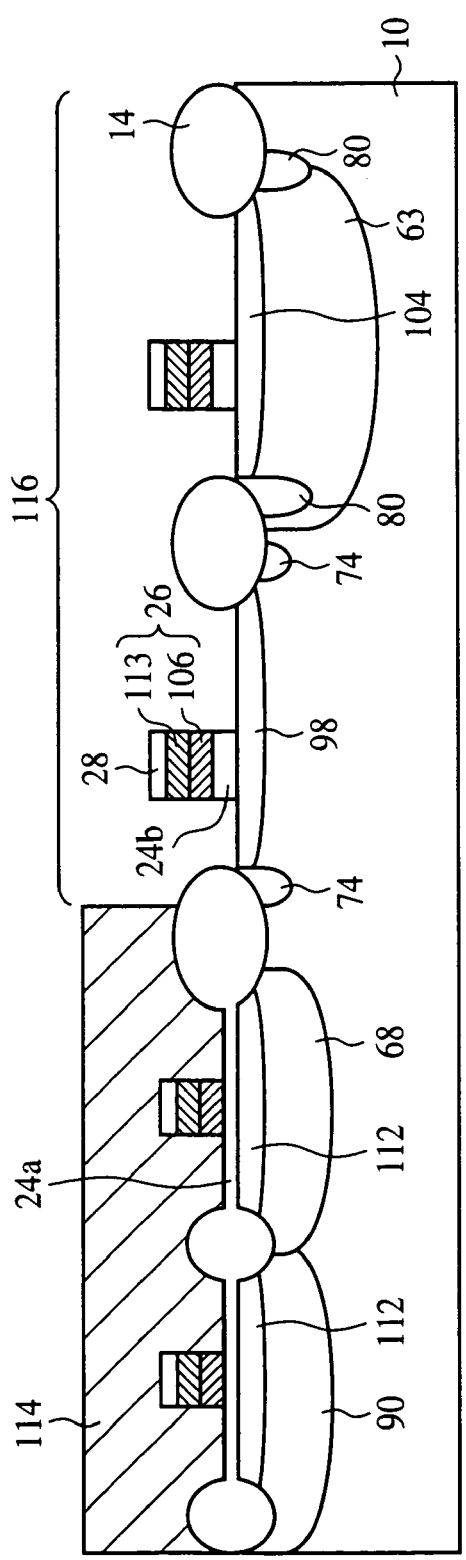
FIGS. 9A and 9B are sectional views of the semiconductor device according to the embodiment in the steps of the method for fabricating the semiconductor device, which show the method (Part 7).

Then, as shown in FIG. 9A, a photoresist film 114 is formed on the entire surface by, e.g., spin coating. Next, an opening 116 for opening the regions 18p, 18n for the high withstand voltage transistor to be formed in is formed in the photoresist film 114 by photolithography.

Next, with the photoresist film 114 and the gate electrode 26 of the high withstand voltage transistor region as a mask, the gate insulation film 24b on both sides of the gate electrode 26 of the high withstand voltage transistor.

Figure 9B:
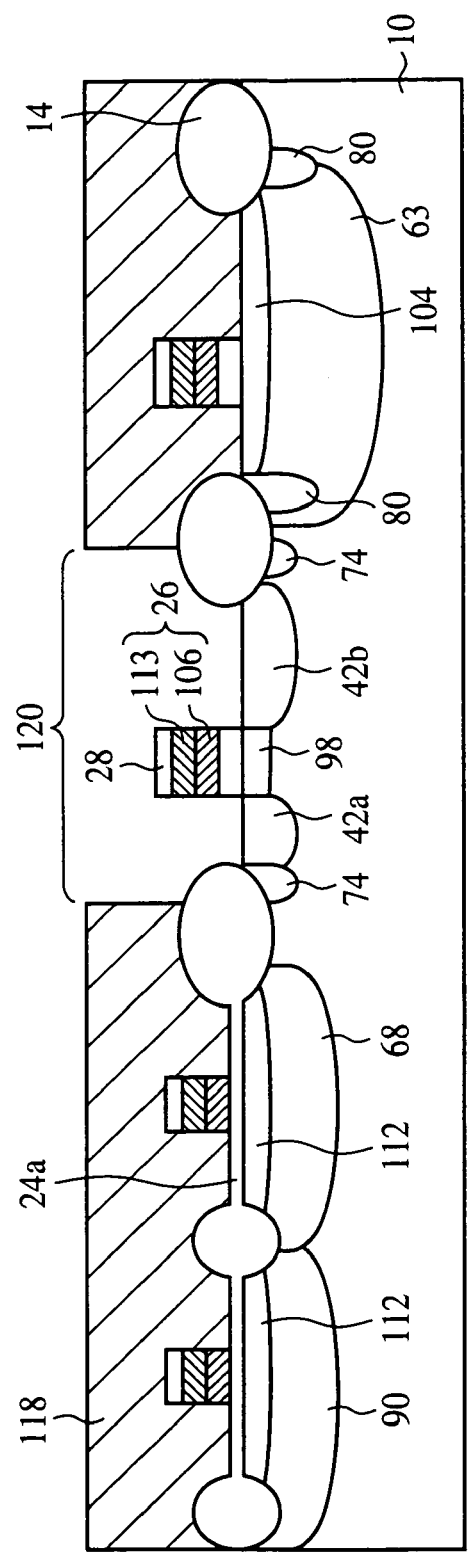

Then, as shown in FIG. 9B, a photoresist film 118 is formed on the entire surface by, e.g., spin coating. Then, an opening 120 for opening the region 18n for the n-channel transistor of the high withstand voltage region is formed in the photoresist film 118 by photolithography.

Next, with the photoresist film 118 and the gate electrode 26 as a mask, an n type dopant is implanted into the semiconductor substrate 10 by, e.g., ion implantation. The dopant is, e.g., P (phosphorus). Conditions for the ion implantation are, e.g., a 60–90 keV acceleration energy and a 3×10$^{12}$ cm$^{-2}$ dose. A lightly doped source region 42a and a lightly doped drain region 42b are thus formed in the semiconductor substrate 10 on both sides of the gate electrode 26.

Figure 10A:
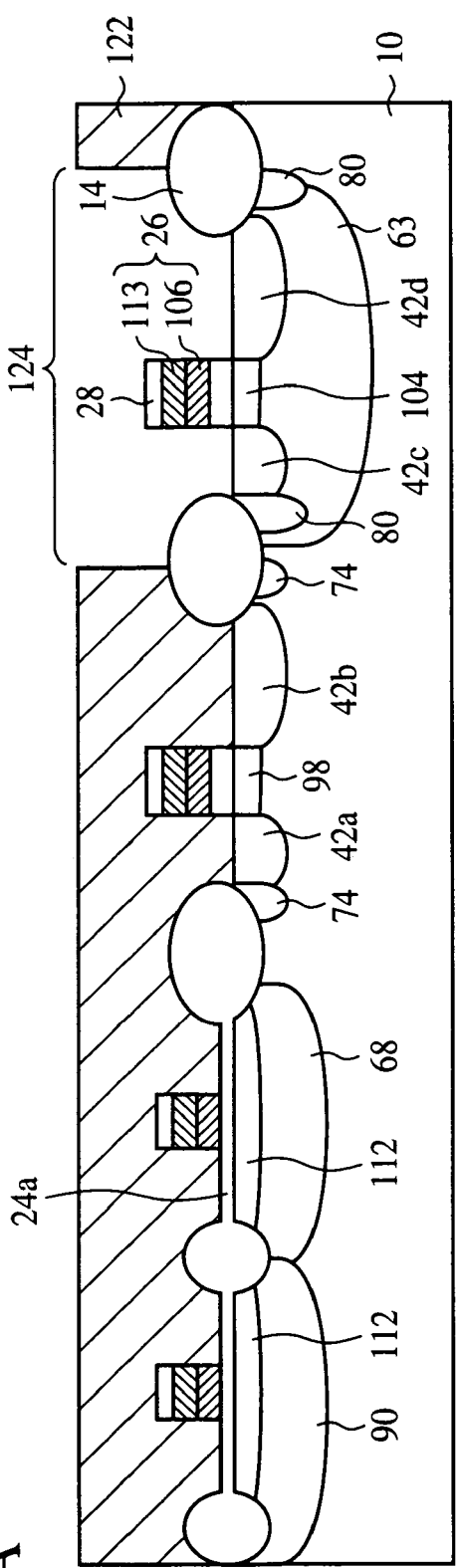
FIGS. 10A and 10B are sectional views of the semiconductor device according to the embodiment in the steps of the method for fabricating the semiconductor device, which show the method (Part 8).

Then, as shown in FIG. 10A, a photoresist film is formed on the entire surface by, e.g., spin coating. Then, an opening 124 for opening the region 18p for the p-channel transistor of the high withstand voltage region to be formed in is formed in the photoresist film by photolithography.

Next, with the photoresist film 122 and the gate electrode 26 as a mask, an n type dopant is implanted into the semiconductor substrate 10 by, e.g., ion implantation. The dopant is, e.g., B. Conditions for the ion implantation are, e.g., a 45 keV acceleration energy and a 3×10$^{12}$ cm$^{-2}$ dose. The lightly doped source region 42c and the lightly doped drain region 42d are thus formed in the semiconductor substrate 10 on both sides of the gate electrode 26.

Figure 10B:
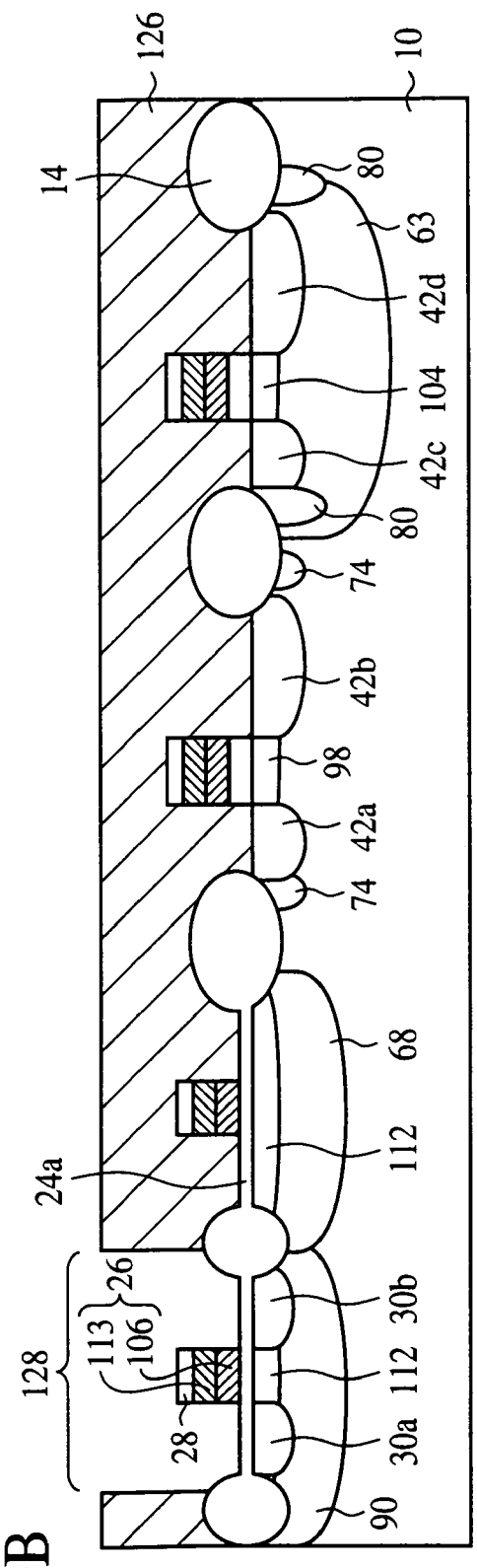

Then, as shown in FIG. 10B, a photoresist film 126 is formed on the entire surface by, e.g., spin coating. Next, an opening 128 for opening the region 16n for the n-channel transistor of the logic region to be formed in is formed in the photoresist film 126 by photolithography.

Next, with the photoresist film 126 and the gate electrode 26 as a mask, an n type dopant is implanted by, e.g., ion implantation. The dopant is, e.g., P. Conditions for the ion implantation are, e.g., a 20 keV acceleration energy and a 4×10$^{13}$ cm$^{-2}$ dose. The lightly doped source region 30a and the lightly doped drain region 30b are formed in the semiconductor substrate 10 on both sides of the gate electrode 26.

Then, as shown in FIG. 11A, a photoresist film 130 is formed on the entire surface by, e.g., spin coating. Then, an opening 132 for opening the region 16p for the p-channel transistor of the logic region to be formed in is formed in the photoresist film 130 by photolithography.

Next, with the photoresist film 130 and the gate electrode 26 as a mask, a p type dopant is implanted by, e.g., ion implantation. The dopant is, e.g., BF$_2^+$. Conditions for the ion implantation are, e.g., a 20 keV acceleration energy and a 1×10$^{13}$ cm$^{-2}$ dose. The lightly doped source region 30c and the lightly doped drain region 30d are thus formed in the semiconductor substrate 10 on both sides of the gate electrode 26.

Then, a 120 nm-thickness SiO$_2$ insulation film is formed by, e.g., CVD. Then, the insulation film is anisotropically etched. The sidewall insulation film 32 is thus formed on the side wall of the gate electrode 26 (see FIG. 11B).

Figure 12A:
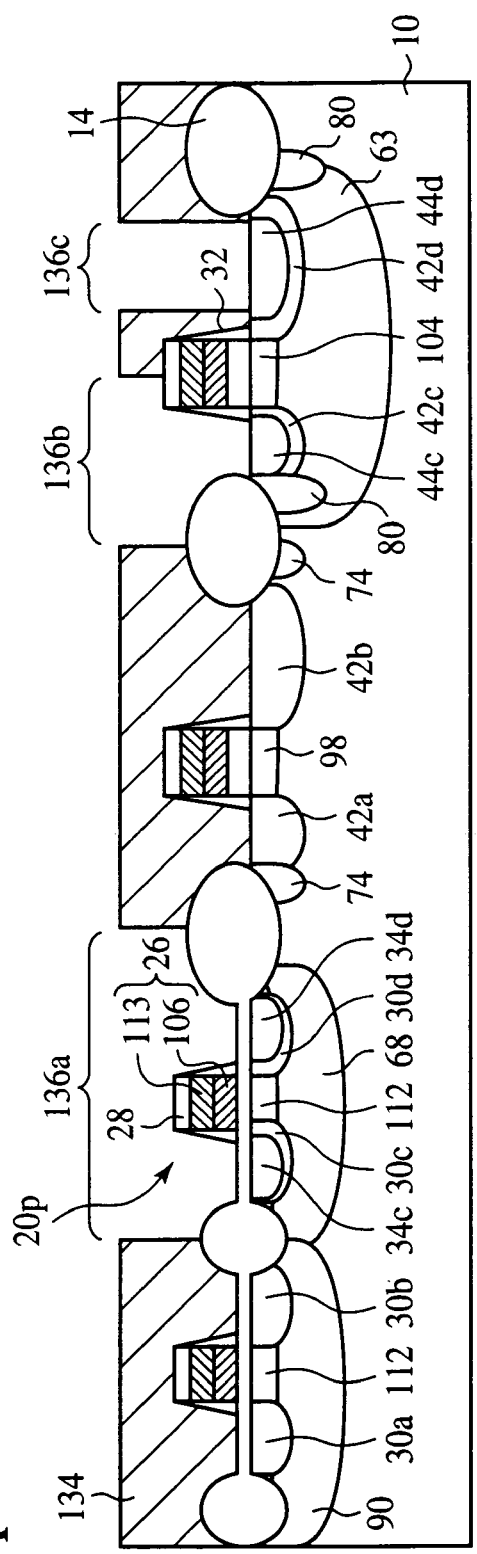
FIGS. 12A and 12B are sectional views of the semiconductor device according to the embodiment in the steps of the method for fabricating the semiconductor device, which show the method (Part 10).

Next, as shown in FIG. 12A, a photoresist film 134 is formed on the entire surface by, e.g., spin coating. Then, openings 136a–136c are formed in the photoresist film 134 by photolithography. The opening 136a is for forming the heavily doped source region 34c and the heavily doped drain region 34d of the p-channel transistor 20p of the logic region. The opening 136b is for forming the heavily doped source region 44c of the p-channel transistor 22p of the high withstand voltage region. The opening 136c is for forming the heavily doped drain region 44d of the p-channel transistor 22p of the high withstand voltage region.

Then, with the photoresist film 134 as a mask, a p type dopant is implanted. The dopant is, e.g., BF$_2$. Conditions for the ion implantation are, e.g., a 20 keV acceleration voltage and a 3×10$^{15}$cm$^{-2}$ dose. The heavily doped source region 34c and the heavily doped drain region 34d are thus formed in the semiconductor substrate 10 on both sides of the gate electrode 26 in the region 16p for the p-channel MOS transistor of the logic region. The heavily doped source region 44c and the heavily doped drain region 44d are formed in the semiconductor substrate 10 on both sides of the gate electrode 26 in the region 18p for the p-channel MOS transistor of the high withstand voltage region.

Figure 12B:
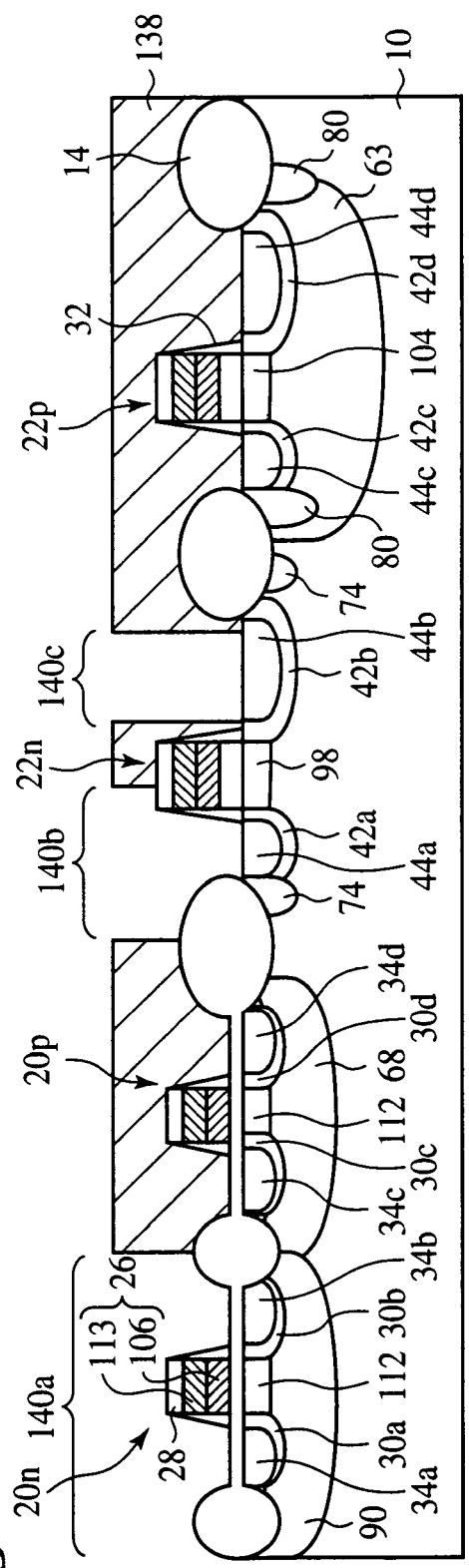

Next, as shown in FIG. 12B, a photoresist film 138 is formed on the entire surface by, e.g., spin coating. Then, openings 140a, 140b, 140c are formed in the photoresist film 138 by photolithography. The photoresist film is thus patterned to cover the peripheral part of the lightly doped drain region 42d. The opening 140a is for forming the heavily doped source region 34a and the heavily doped drain region 34b of the n-channel transistor 20n of the logic region. The opening 140b is for forming the heavily doped source region 44a of the n-channel transistor of the high withstand voltage region. The opening 140c is for forming the heavily doped drain region 44b of the n-channel transistor of the high withstand voltage region.

Then, with the photoresist film 138 and the gate electrode 26 as a mask, an n type dopant is implanted. The dopant is, e.g., As (arsenic). Conditions for the ion implantation are, e.g., a 30 keV acceleration voltage and a $1\times10^{15}$ cm$^{-2}$ dose. The heavily doped source region 34a and the heavily doped drain region 34b are thus formed in the semiconductor substrate 10 on both sides of the gate electrode 26 in the region 16n for the n-channel transistor of the logic region to be formed in. The heavily doped source region 44a and the heavily doped drain region 44b are formed in the semiconductor substrate 10 on both sides of the gate electrode 26.

Next, thermal processing is performed to activate the dopant introduced into the heavily diffused layer.

Then, an insulation film 38 of a 100 nm-thickness SiO$_2$ film is formed on the entire surface by, e.g., low temperature plasma CVD.

Figure 13A:
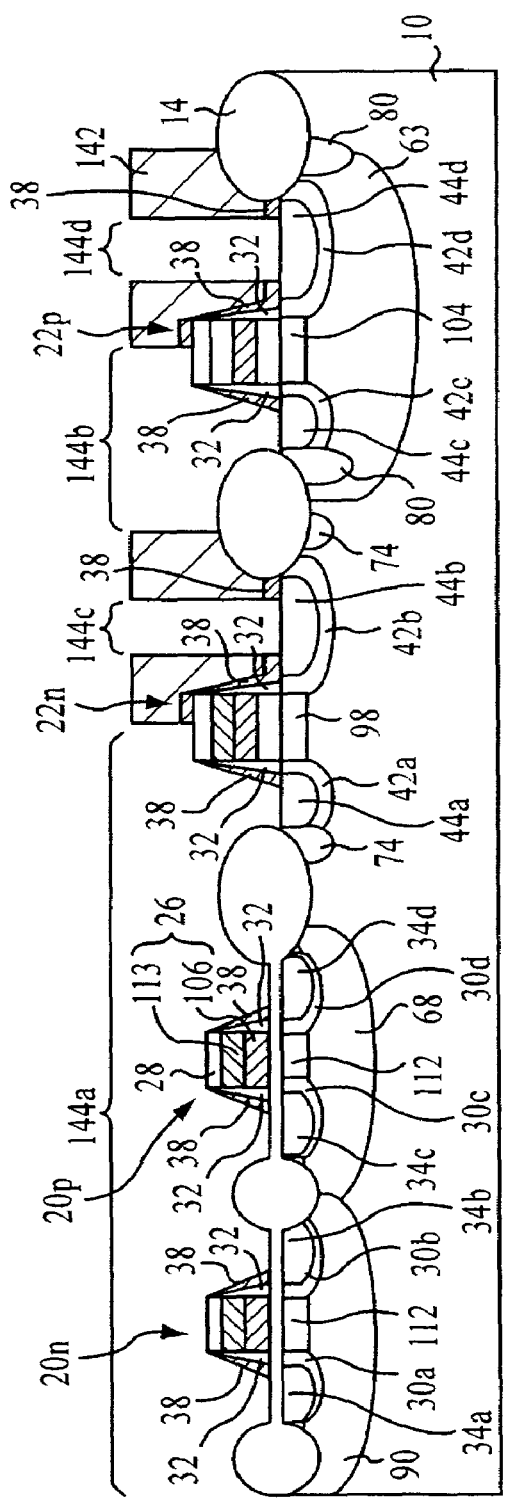
FIGS. 13A and 13B are sectional views of the semiconductor device according to the embodiment in the steps of the method for fabricating the semiconductor device, which show the method (Part 11).

Then, as shown in FIG. 13A, a photoresist film 142 is formed on the entire surface by, e.g., spin coating. Then, openings 144a–144d are formed in the photoresist film 142 by photolithography. The photoresist film 142 is thus patterned to cover the peripheral part of the lightly doped drain region 42b. The opening 144a is for opening the region 16 for the transistor of the logic region to be formed in and the source-side region of the n-channel transistor 22n of the high withstand voltage region. The opening 144b is for opening the source-side region of the p-channel transistor 22p of the high withstand voltage region. The opening 144c is for opening the region for the drain-side silicide layer 40d of the n-channel transistor 22n of the high withstand voltage region. The opening 144c is formed with a distance between the edge of the opening 144c on the side of the gate electrode 26 and the edge of the heavily doped drain region 44b on the side of the gate electrode 26 made, e.g., 3 μm. The opening 144d is for opening the region for the drain-side silicide layer 40h of the p-channel transistor 22p of the high withstand voltage. The opening 144d is formed with a distance between the edge of the opening 144d on the side of the gate electrode 26 and the edge of the heavily doped drain region 44d on the side of the gate electrode 26 made, e.g., 3 μm.

Then, with the photoresist film 142 as a mask, the insulation film 38 is anisotropically etched. The sidewall insulation film 38 is further formed on the side wall of the gate electrode with the sidewall insulation film 32 formed on. In the drain-side of the transistor 22n, 22p of the high withstand voltage region, the sidewall insulation film 38 is left, covering the peripheral parts of the heavily doped drain regions 44b, 44d and the lightly doped drain regions 42b, 42d. The insulation film 38 left in the drain-side of the transistor 22n, 22p of the high withstand voltage region functions as a mask for forming the silicide layer 40 only in a required region of the surface of the semiconductor substrate 10.

Figure 13B:
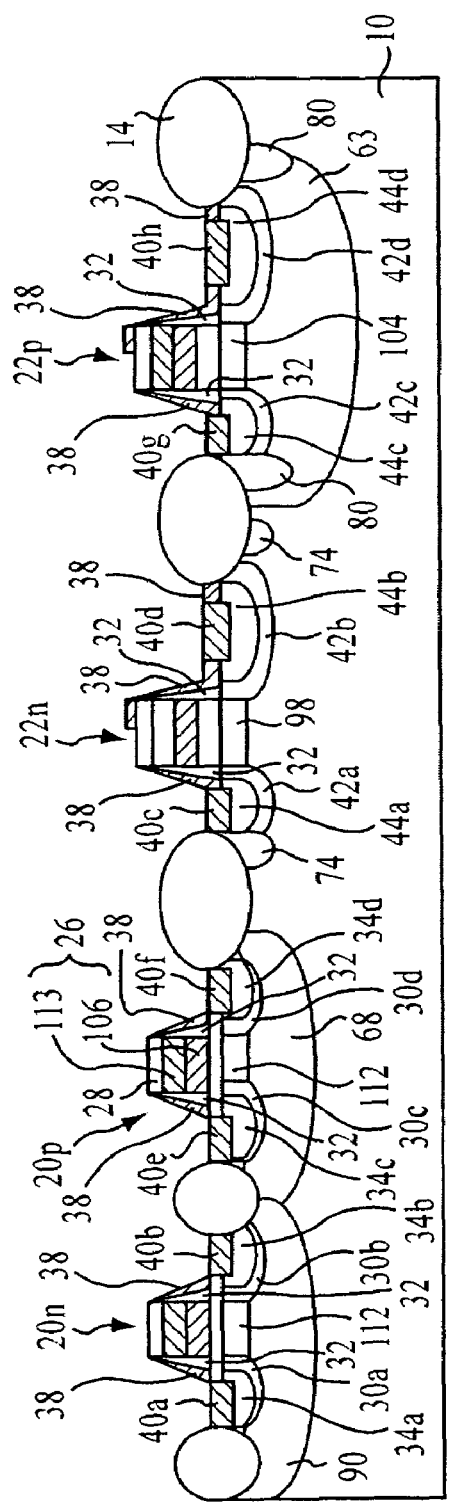

Next, as shown in FIG. 13B, the silicide film 40a–40h of, e.g., titanium silicide is formed on the exposed surface of the semiconductor substrate 10.

Figure 14A:
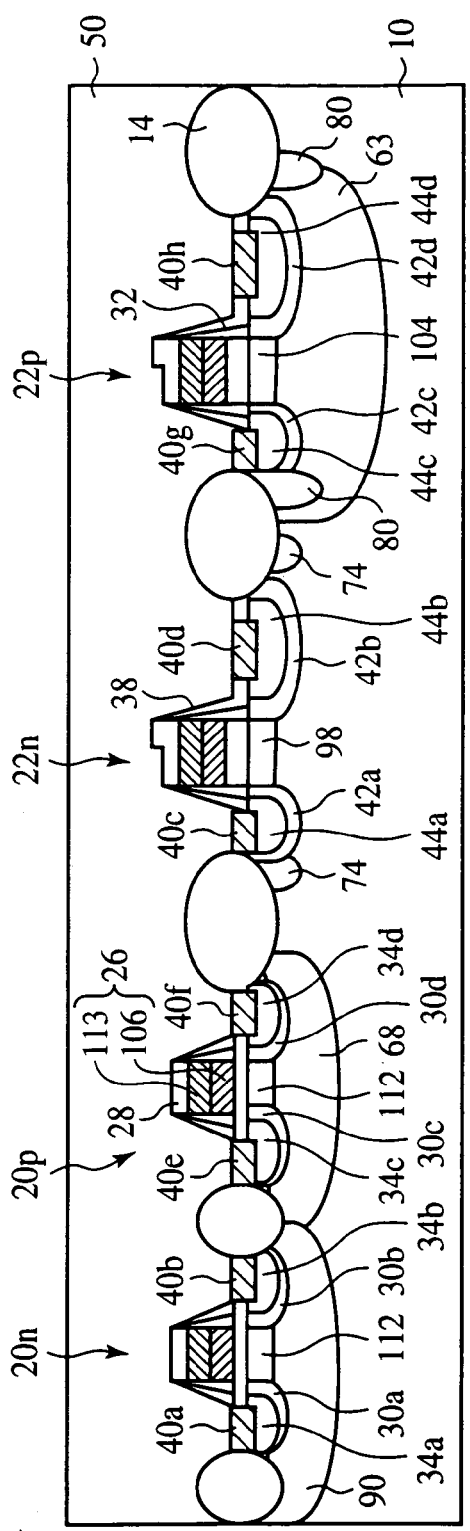
FIGS. 14A and 14B are sectional views of the semiconductor device according to the embodiment in the steps of the method for fabricating the semiconductor device, which show the method (Part 12).
Figure 14B:
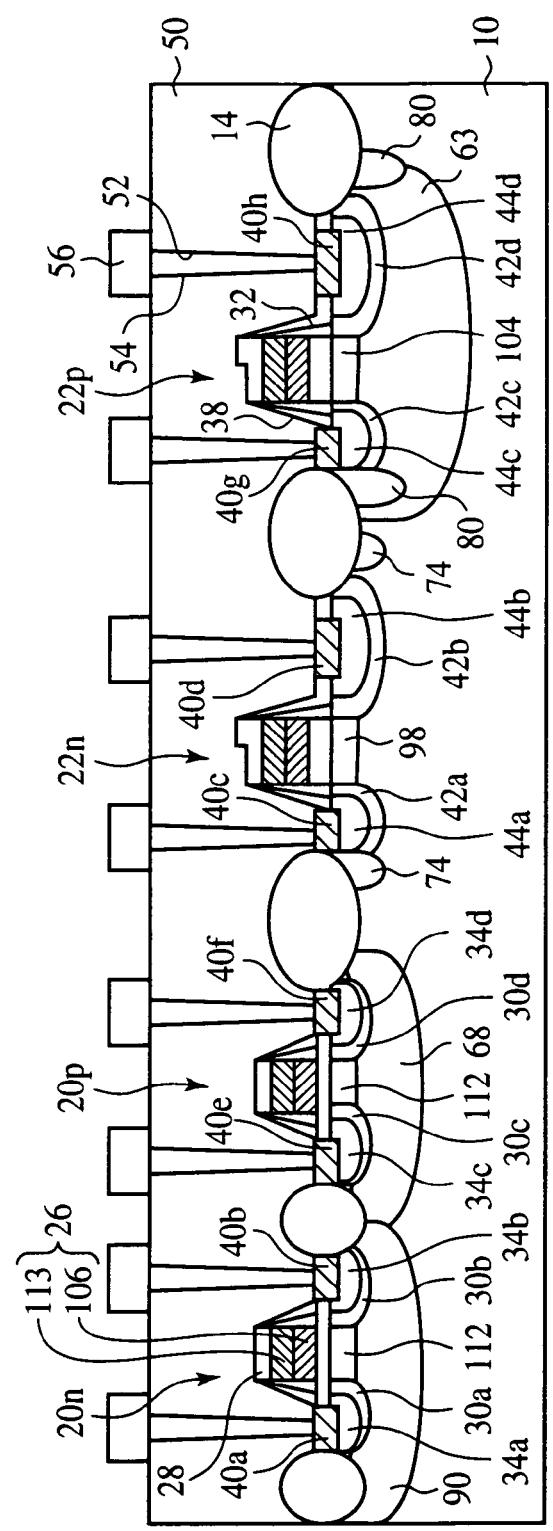

Then, as shown in FIG. 14a, the inter-layer insulation film 50 of a 700 nm-thickness SiO$_2$ film is formed on the entire surface by, e.g., CVD.

Next, the contact holes 52 are formed in the inter-layer insulation film 50 down to the silicide film 40. At this time, the contact holes 52 are formed down to the region of the silicide film 40 except the peripheral part thereof.

Then, the conductor plugs 54 are buried in the contact holes 52.

Next, a conductor film of a 500 nm-thickness Al film is formed, e.g., PVD (Physical Vapor Deposition). Then, the conductor film is patterned by photolithography to form the interconnections 56. The interconnections 56 are thus formed, connected to the conductor plugs 54.

Thus, the semiconductor device according to the present embodiment is fabricated.

(Modifications)

Figure 15:
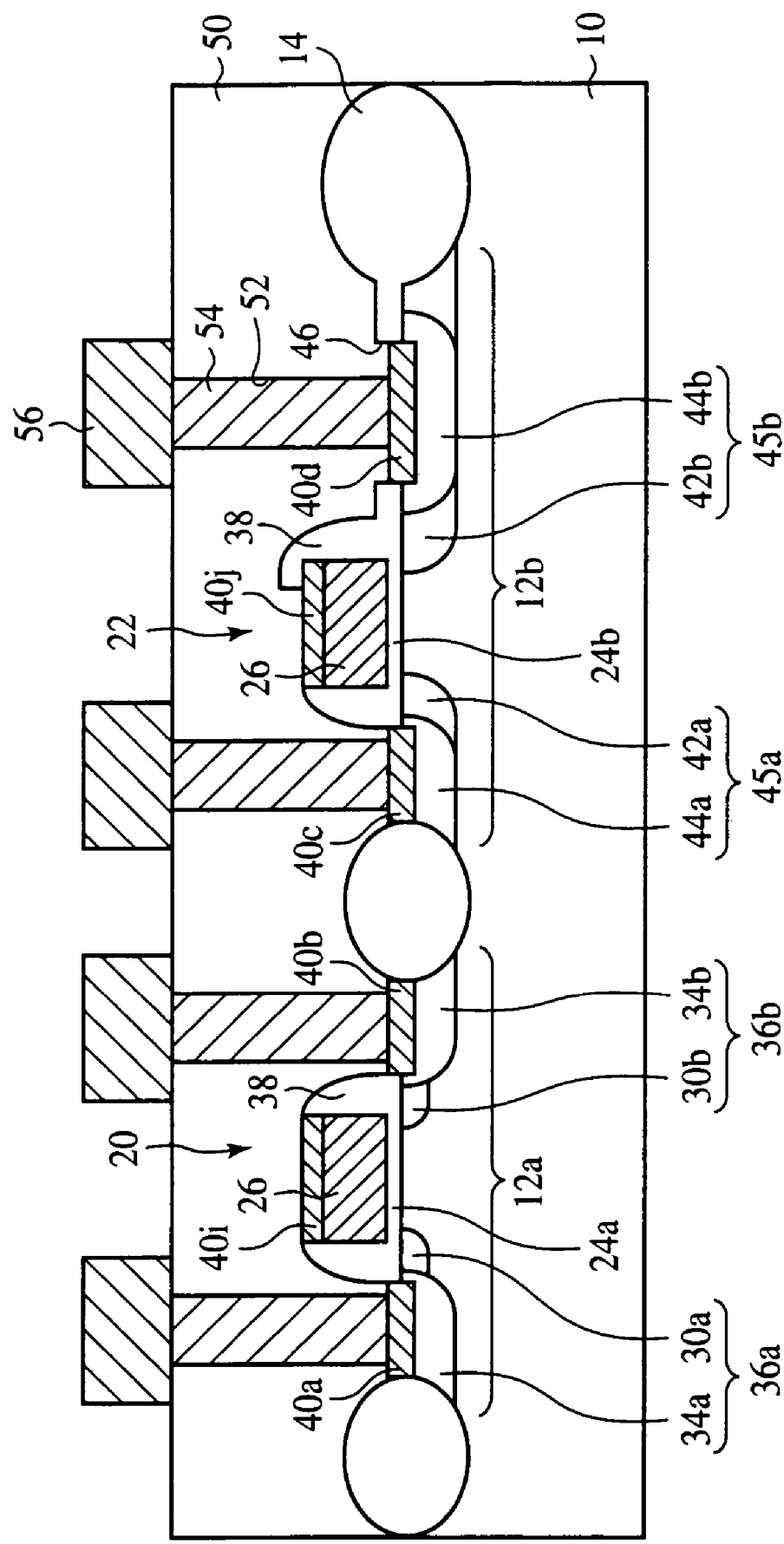
FIG. 15 is a sectional view of a modification of the semiconductor device according to the embodiment of the present invention.

Next, modifications of the semiconductor device according to the present embodiment will be explained with reference to FIG. 15. FIG. 15 is a sectional view of the semiconductor device according to the present modification.

The semiconductor device according to the present modification is characterized mainly in that the silicide layer 40i, 40j is formed also on the gate electrode 26.

As shown in FIG. 15, in the semiconductor device according to the present modification, the silicide layer 40i, 40j is formed on the gate electrode 26. The silicide layer 40i, 40j can be formed concurrently with forming the silicide layer 40a–40h.

As described above, the silicide layer 40i, 40j may be formed also on the gate electrode 26. According to the present modification, the silicide layer 40i, 40j, whose electric resistance is low, can decrease the resistance of the gate electrode 26.

[Modifications]

The present invention is not limited to the above-described embodiment and can cover other various modifications.

For example, in the above-described embodiment, the present invention is applied to the semiconductor device having the logic transistors and the transistors of the high withstand voltage transistors mixedly formed. However, the logic transistors and the transistors of the high withstand voltage region are not essentially mixed. The present invention is applicable to, e.g., semiconductor devices having high withstand voltage transistors.

The above-described embodiment uses the structure as described above, that high withstand voltage can be obtained only in the drain region of the high withstand voltage transistor. However, the above-described structure in which high withstand voltage can be obtained also in the source region of the high withstand voltage transistors. However, when the above-described structure, in which high withstand voltages can be obtained also in the source region, is used, the source-drain electric resistance further rises. In terms of making the source-drain electric resistance low, preferably the above-described structure, in which high withstand voltages can be obtained only in the drain region is used.

What is claimed is:

1. A method for fabricating a semiconductor device comprising steps of:

forming a gate electrode on a semiconductor substrate with a gate insulation film formed therebetween;

implanting a dopant into the semiconductor substrate with the gate electrode as a mask to form a lightly doped source region in the semiconductor substrate on one side of the gate electrode and a lightly doped drain region in the semiconductor substrate on the other side of the gate electrode;

forming a sidewall insulation film on the side wall of the gate electrode;

implanting a dopant into the semiconductor substrate with a first mask covering a peripheral part of the lightly doped drain region, with the gate electrode and the sidewall insulation film as another mask, to form a heavily doped source region in the semiconductor substrate on the one side of the gate electrode and a heavily doped drain region in a region of the lightly doped drain region except a peripheral part of the lightly doped drain region;

removing the first mask and forming a second mask covering an entire peripheral part top surface of the heavily doped drain region, wherein the second mask exposing the heavily doped source region and a top portion of the gate electrodes; and forming a first silicide layer on the heavily doped source region and a second silicide layer in a region of the heavily doped drain region except the entire peripheral part top surface of the heavily doped drain region, with the second mask as a mask.

2. A method for fabricating a semiconductor device according to claim 1, further comprising, after the step of forming the first silicide layer and the second silicide layer, forming a first conductor plug connected to the first silicide layer and a second conductor plug connected to the second silicide layer, and in which in the step of forming the first conductor plug and the second conductor plug, the second conductor plug being formed down to a part of the second silicide layer except a peripheral part of the second silicide layer.

3. A method for fabricating a semiconductor device according to claim 2, wherein in the step of forming the first conductor plug and the second conductor plug, the first conductor plug is formed down to a part of the first silicide layer except a peripheral part of the first silicide layer.

4. A method for fabricating a semiconductor device according to claim 2, wherein in the step of forming the first silicide layer and the second silicide layer, a third silicide layer is further formed on the gate electrode.

* * * * *